US012453140B2

(12) United States Patent
Cho et al.

(10) Patent No.: US 12,453,140 B2
(45) Date of Patent: Oct. 21, 2025

(54) SUPERJUNCTION SEMICONDUCTOR DEVICE AND METHOD OF MANUFACTURING SAME

(71) Applicant: DB HiTek Co., Ltd., Bucheon-si (KR)

(72) Inventors: Won Kook Cho, Bucheon-si (KR); Myeong Bum Pyun, Incheon (KR)

(73) Assignee: DB HiTek Co., Ltd., Bucheon-si (KR)

( * ) Notice: Subject to any disclaimer, the term of this patent is extended or adjusted under 35 U.S.C. 154(b) by 447 days.

(21) Appl. No.: 18/147,698

(22) Filed: Dec. 28, 2022

(65) Prior Publication Data

US 2023/0231010 A1  Jul. 20, 2023

(30) Foreign Application Priority Data

Jan. 19, 2022 (KR) .................. 10-2022-0007668

(51) Int. Cl.
*H10D 62/10* (2025.01)
*H10D 30/66* (2025.01)

(52) U.S. Cl.
CPC ......... *H10D 62/111* (2025.01); *H10D 30/665* (2025.01); *H10D 62/105* (2025.01); *H10D 62/107* (2025.01)

(58) Field of Classification Search
CPC ... H10D 30/665; H10D 62/105; H10D 62/107
See application file for complete search history.

(56) References Cited

U.S. PATENT DOCUMENTS

| 7,301,203 | B2 | 11/2007 | Lee et al. |
| 7,655,981 | B2 | 2/2010 | Lee et al. |
| 10,205,009 | B2 | 2/2019 | Lee et al. |
| 2005/0116313 | A1 | 6/2005 | Lee et al. |
| 2008/0211053 | A1 | 9/2008 | Lee et al. |
| 2017/0054009 | A1* | 2/2017 | Lee ...................... H10D 30/665 |

FOREIGN PATENT DOCUMENTS

| KR | 10-2005-0052597 A | 6/2005 |
| KR | 10-2017-0022418 A | 3/2017 |

* cited by examiner

*Primary Examiner* — Daniel P Shook
(74) *Attorney, Agent, or Firm* — CENTRAL CALIFORNIA IP GROUP, P.C.; Andrew D. Fortney

(57) ABSTRACT

Disclosed are a superjunction semiconductor device and a method of manufacturing the same. More particularly, a superjunction semiconductor device and a method of manufacturing the same include an additional structure that enables smooth current flow in a transition region and/or a ring region of the device, where the current concentrates locally during turn-on/turn-off operations of the device due to insufficient current paths compared to the cell region of the device, thereby improving reverse recovery characteristics and preventing device destruction.

13 Claims, 20 Drawing Sheets

SUPERJUNCTION SEMICONDUCTOR DEVICE AND METHOD OF MANUFACTURING SAME

CROSS REFERENCE TO RELATED APPLICATION

The present application claims priority to Korean Patent Application No. 10-2022-0007668, filed Jan. 19, 2022, the entire contents of which are incorporated herein for all purposes by this reference.

BACKGROUND OF THE INVENTION

Field of the Invention

The present disclosure relates generally to a super-junction semiconductor device and a method of manufacturing the same. More particularly, the present disclosure relates to a superjunction semiconductor device and a method of manufacturing the same, including an additional structure that enables relatively smooth current flow in a transition region and/or a ring region, where the current may be locally concentrated during turn-on and turn-off operations of the device due to a relatively small number of current paths compared to the neighboring cell region, thereby improving reverse recovery characteristics and preventing device destruction.

Description of the Related Art

In the case of high-voltage or power metal-oxide-semiconductor field-effect transistors (MOSFETs), in order to increase the breakdown voltage to improve the high-voltage characteristics, there is a need to increase the specific resistance and thickness of a drift region. However, due to the fact that the breakdown voltage is proportional to the on-resistance, the increase in the specific resistance causes an increase in the on-resistance.

In an attempt to solve such a problem, superjunction power MOSFETs in which a p-type region and an n-type region alternate under the active region have been introduced. The alternating p-type and n-type regions are ideal for charge balancing so that they deplete each other under reverse voltage conditions and thus are highly resistant to breakdown. Accordingly, the use of superjunction power MOSFETs having so-called "stripe" P-type pillars, with high-voltage characteristics and low on-resistance characteristics compared to existing planar power MOSFETs, is increasing.

FIG. 1 is a cross-sectional view illustrating a superjunction semiconductor device 9 according to the related art. FIG. 2 is a plan view illustrating the superjunction semiconductor device 9 illustrated in FIG. 1.

Hereinafter, the structure of the super-junction semiconductor device 9 according to the related art and the problems thereof will be briefly described with reference to the accompanying drawings.

First, referring to FIG. 1, the superjunction semiconductor device 9 according to the related art includes a plurality of pillars 920 in an epitaxial layer 910 in a cell region C and a ring region R. The pillars 920 are spaced apart from each other. In addition, a first body region 930 is electrically connected to each of the pillars 920 (e.g., at an uppermost surface or portion) in the cell region C. A source contact 940 is on each first body region 930. Each source contact 940 serve as a current path during a switching operation of the device 9. However, in a transition region T, since a contact 942 is on each second body region 932, and the second body region 932 is shared by a plurality of pillars 920 in the transition region T, the number of second body regions 932 is relatively small compared to the first body region 930 of the cell region C. This means that the number of transition contacts 942 is smaller than that of the source contacts 940. In addition, no separate contact is formed in the ring region R.

Thus, while the current in the cell region C can flow through a plurality of current paths (that is, to and/or through respective source contacts 940), the current in the transition region T and the ring region R can flow only through a limited number of current paths (that is, to and/or through the transition contacts 942). As a result, the current inevitably concentrates locally on or in the contacts 942. This is a major cause of defects and device destruction.

Also, referring to FIG. 2, the super-junction semiconductor device 9 according to the related art includes a plurality of second body regions 932 spaced apart from each other along the extension direction of the transition region T. Since the contact 942 is not in the space between adjacent second body regions 932, the contact 942 is in a limited area of the transition region T. Therefore, the contact 942 corresponding to each of the second body regions 932 in the limited area of the transition region T may be insufficient to handle current flow in the transition region T during switching of the device 9. This may also be the main factor that limits smooth flow of current.

To overcome the above problems, the present inventors have conceived a novel superjunction semiconductor device with an improved structure and a method of manufacturing the same, which will be described in detail later.

The foregoing is intended merely to aid in the understanding of the background of the present disclosure, and is not intended to mean that the present disclosure falls within the purview of the related art, or that any part of the present disclosure is already known to those skilled in the art.

DOCUMENT OF RELATED ART

Korean Patent Application Publication No. 10-2005-0052597, entitled "Superjunction Semiconductor Device."

SUMMARY OF THE INVENTION

Accordingly, the present disclosure has been made keeping in mind the above problems occurring in the related art, and an objective of the present disclosure is to provide a superjunction semiconductor device and a method of manufacturing the same, including an additional structure that enables smooth current flow in a transition region and/or a ring region of the device, where current concentrates locally during a switching operation due to an insufficient number of current paths compared to the cell region or the device, thereby improving reverse recovery characteristics and preventing device destruction.

Specifically, a connector having a first conductivity type that connects adjacent pillars (e.g., second and third pillars, or adjacent second pillars, at respective upper portions thereof) close to the transition region secures or provides an additional current path due to an increased PN junction area of the pillars, thereby reducing or preventing current concentration in a specific region of the device.

Another objective of the present disclosure is to provide a superjunction semiconductor device and a method of manufacturing the same, in which a second body region in a transition region is continuous in an area corresponding to a first ring region (e.g., a ring X region), a second ring region (e.g., a ring Y region) and/or a ring corner region, thereby increasing an effective area of a second contact, and thus reducing or preventing current concentration.

Another objective of the present disclosure is to provide a superjunction semiconductor device and a method of manufacturing the same, in which a second contact on an epitaxial layer extends to the boundary between the ring region and the transition region or to a position within the ring region, thereby reducing or preventing current concentration.

In order to achieve the above objectives, according to one aspect of the present disclosure, there is provided a superjunction semiconductor device including a substrate; an epitaxial layer on the substrate; pillars in the epitaxial layer, the pillars including a plurality of first pillars in a cell region (e.g., of the substrate or the superjunction semiconductor device), a plurality of second pillars in a ring region (e.g., of the substrate or the superjunction semiconductor device), and a plurality of third pillars in a transition region (e.g., of the substrate or the superjunction semiconductor device); a first body region in the epitaxial layer and electrically connected to a corresponding one of the first pillars; a source in the first body region; a gate on the epitaxial layer; an interlayer insulating layer on the epitaxial layer and covering the gate; a first contact in the cell region and passing through the interlayer insulating layer; a second contact in the transition region and passing through the interlayer insulating layer; and a connector connecting adjacent pillars.

According to another aspect of the present disclosure, each of the pillars and the connector may comprise an impurity region having the first conductivity type.

According to another aspect of the present disclosure, the second pillars and the third pillars may be spaced apart from each other along a first direction in the epitaxial layer, and the connector may connect adjacent second and third pillars close to a boundary between the transition region and the ring region.

According to another aspect of the present disclosure, the connector may connect adjacent second pillars close to the boundary between the transition region and the ring region.

According to another aspect of the present disclosure, the connector may have a first vertical width less than half of a second vertical width of each of the second pillars and/or the third pillars.

According to another aspect of the present disclosure, the superjunction semiconductor device may further include a second body region in the epitaxial layer and electrically connecting the second pillars along a first direction.

According to another aspect of the present disclosure, the second body region may be continuous (e.g., along an extension direction of or in the transition region, optionally in a plan view of the substrate or the superjunction semiconductor device) at least in a corner area of the transition region.

According to another aspect of the present disclosure, the second contact may be continuous (e.g., along the extension direction of or in the transition region, optionally in the plan view of the substrate or the superjunction semiconductor device) at least in the corner area of the transition region.

According to another aspect of the present disclosure, the second body region may include a plurality of second body regions spaced apart from each other in the transition region (e.g., along the extension direction of the transition region in the plan view of the substrate or the superjunction semiconductor device), and the second contact may extend to the boundary between the transition region and the ring region.

According to another aspect of the present disclosure, there is provided a superjunction semiconductor device including a substrate; an epitaxial layer on the substrate; pillars in the epitaxial layer, the pillars including a plurality of first pillars in a cell region (e.g., of the substrate or the superjunction semiconductor device), a plurality of second pillars in a ring region (e.g., of the substrate or the superjunction semiconductor device), and a plurality of third pillars in a transition region (e.g., of the substrate or the superjunction semiconductor device); a first body region in the epitaxial layer and electrically connected to a corresponding one of the first pillars; a second body region in the epitaxial layer and connecting the second pillars along a first direction; a gate on the epitaxial layer; an interlayer insulating layer on the epitaxial layer and covering the gate; a first contact in the cell region and passing through the interlayer insulating layer; and a second contact in the transition region and passing through the interlayer insulating layer, wherein the second contact may be at least partially continuous in the transition region (e.g., along an extension direction of the transition region, optionally in a plan view of the substrate or the superjunction semiconductor device).

According to another aspect of the present disclosure, the second contact may be continuous (e.g., along the extension direction of or in the transition region in the plan view), at least in a corner area of the transition region.

According to another aspect of the present disclosure, the second body region may be continuous (e.g., in a band or a band shape, along the extension direction of or in the transition region in the plan view) in the entire area of the transition region.

According to another aspect of the present disclosure, there is provided a superjunction semiconductor device including a substrate; an epitaxial layer on the substrate; pillars in the epitaxial layer, the pillars including a plurality of first pillars in a cell region (e.g., of the substrate or the superjunction semiconductor device), a plurality of second pillars in a ring region (e.g., of the substrate or the superjunction semiconductor device), and a plurality of third pillars in a transition region (e.g., of the substrate or the superjunction semiconductor device); a first body region in the epitaxial layer and electrically connected to a corresponding one of the first pillars; a second body region in the epitaxial layer and connecting the second pillars along a first direction; a gate on the epitaxial layer; an interlayer insulating layer on the epitaxial layer and covering the gate; a first contact in the cell region and passing through the interlayer insulating layer; and a second contact in the transition region and passing through the interlayer insulating layer, wherein the second contact may extend to a position close to a boundary between the transition region and the ring region.

According to another aspect of the present disclosure, the second body region may include a plurality of second body regions spaced apart from each other along an extension direction of the transition region in a plan view (e.g., of the substrate or the superjunction semiconductor device).

According to another aspect of the present disclosure, the second contact may be continuous (e.g., along the extension direction of or in the transition region in the plan view) at least in a corner area of the transition region.

According to another aspect of the present disclosure, there is provided a method of manufacturing a superjunction semiconductor device, the method including forming an epitaxial layer on a substrate; forming, in the epitaxial layer, pillars having a first conductivity type, the pillars including a plurality of first pillars, a plurality of second pillars, and a plurality of third pillars; forming a connector having the first conductivity type that connects adjacent second and third pillars (e.g., close to a boundary between the ring region and the transition region of the substrate or the superjunction semiconductor device), or adjacent second pillars (e.g., close to the boundary); forming a gate on the epitaxial layer; forming an interlayer insulating layer on the epitaxial layer and covering the gate; and forming a first contact and a second contact in and/or through the interlayer insulating layer.

According to another aspect of the present disclosure, the connector may connect respective upper portions of the adjacent second or second and third pillars.

According to another aspect of the present disclosure, forming the second contact may include forming, in the transition region, a contact hole in the interlayer insulating layer; filling the contact hole with a conductive material; and removing the conductive material on the interlayer insulating layer (e.g., outside of the contact hole).

According to another aspect of the present disclosure, the contact hole may be continuous (e.g., along an extension direction of or in the transition region, optionally in a plan view of the substrate) in a corner area of the transition region.

According to another aspect of the present disclosure, the method may further include forming, in the epitaxial layer, a plurality of first body regions having the first conductivity type on the first pillars; and forming, in the epitaxial layer, a second body region having the first conductivity type connecting the second pillars, wherein the second body region may be continuous in the transition region (e.g., along the extension direction of the transition region, optionally in the plan view and/or in an area of the transition region, the area corresponding to each of a first ring region [e.g., a ring X region] and/or a second ring region [e.g., a ring Y region]).

The present disclosure has the following effects by the above configuration.

According to the present disclosure, an additional structure that enables smooth current flow in a transition region and/or a ring region of the device, where the current concentrates locally during a switching operation of the device due to insufficient current paths in the transition and/or ring regions compared to the cell region of the device. Thus, it is possible to improve reverse recovery characteristics and prevent device destruction.

Specifically, a connector having the first conductivity type connects adjacent second and third pillars or adjacent second pillars (e.g., at respective upper portions thereof) close to the transition region. Thus, it is possible to secure additional current paths due to an increased PN junction area and thus reduce or prevent current concentration in a specific region of the device.

Furthermore, a second body region formed in the transition region is continuous in an area corresponding to a ring X region and/or a ring Y region and/or a ring corner region. Thus, it is possible to maximally increase an area in which a second contact is to be formed and thus reduce or prevent current concentration.

Furthermore, a second contact on an epitaxial layer extend to the boundary between the ring region and the transition region or to a position within the ring region. Thus, it is possible to reduce or prevent current concentration.

Meanwhile, the effects of the present disclosure are not limited to the effects described above, and other effects not stated directly may be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
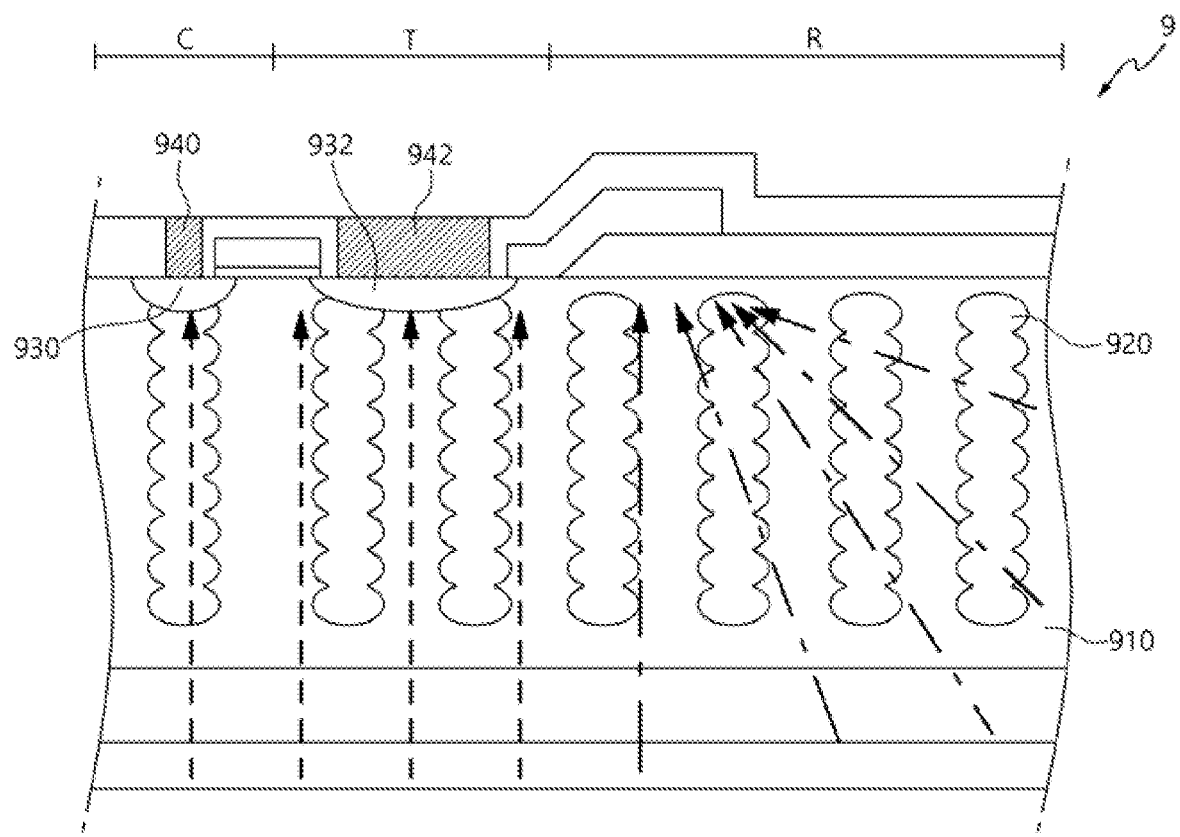
FIG. 1 is a cross-sectional view illustrating a superjunction semiconductor device according to the related art.

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

As used herein, the singular forms are intended to include the corresponding plural forms as well, unless the context clearly indicates otherwise. It will be further understood that the terms "comprise" and/or "comprising", etc., specify the presence of stated features, integers, steps, operations, elements, components, and/or combinations thereof, but do not preclude the presence or addition of one or more other features, integers, steps, operations, elements, components, and/or combinations thereof.

As used herein, when an element (or layer) is referred to as being on another element (or layer), it can be directly on the other element, or one or more intervening elements (or layers) may be therebetween. In contrast, when an element is referred to as being directly on or above another component, no intervening elements are therebetween. Further, the terms "on", "above", "below", "upper", "lower", "one side", "side surface", etc. are used to describe one element's relationship to another element as illustrated in the drawings.

While the terms "first", "second", "third", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or performed in an order opposite to the described order.

The term "metal-oxide-semiconductor (MOS)" used herein is a general term. "M" is not limited to only metal, and may include various types of conductors. "S" may be a substrate or a semiconductor structure. "O" is not limited to only oxide, and may include various types of organic or inorganic insulating materials.

In addition, the conductivity type of a doped region or a dopant element may be defined as "P-type" or "N-type" according to the main carrier characteristics. However, this is only for convenience of description, and the technical spirit of the present disclosure is not limited to the above-mentioned examples. For example, "P-type" or "N-type" may be replaced with the more general terms "first conductivity type" or "second conductivity type" hereinafter, where the first conductivity type may refer to P-type, and the second conductivity type may refer to N-type.

It should be further understood that the terms "heavily doped" and "lightly doped" representing the doping concentration of an impurity region refer the relative concentrations or doses of dopant elements in the impurity region.

In addition, it should be understood that "first direction" may refer to an x-axis direction in the plan view, and "second direction" may refer to a y-axis or other direction orthogonal to the x-axis direction.

Figure 3:
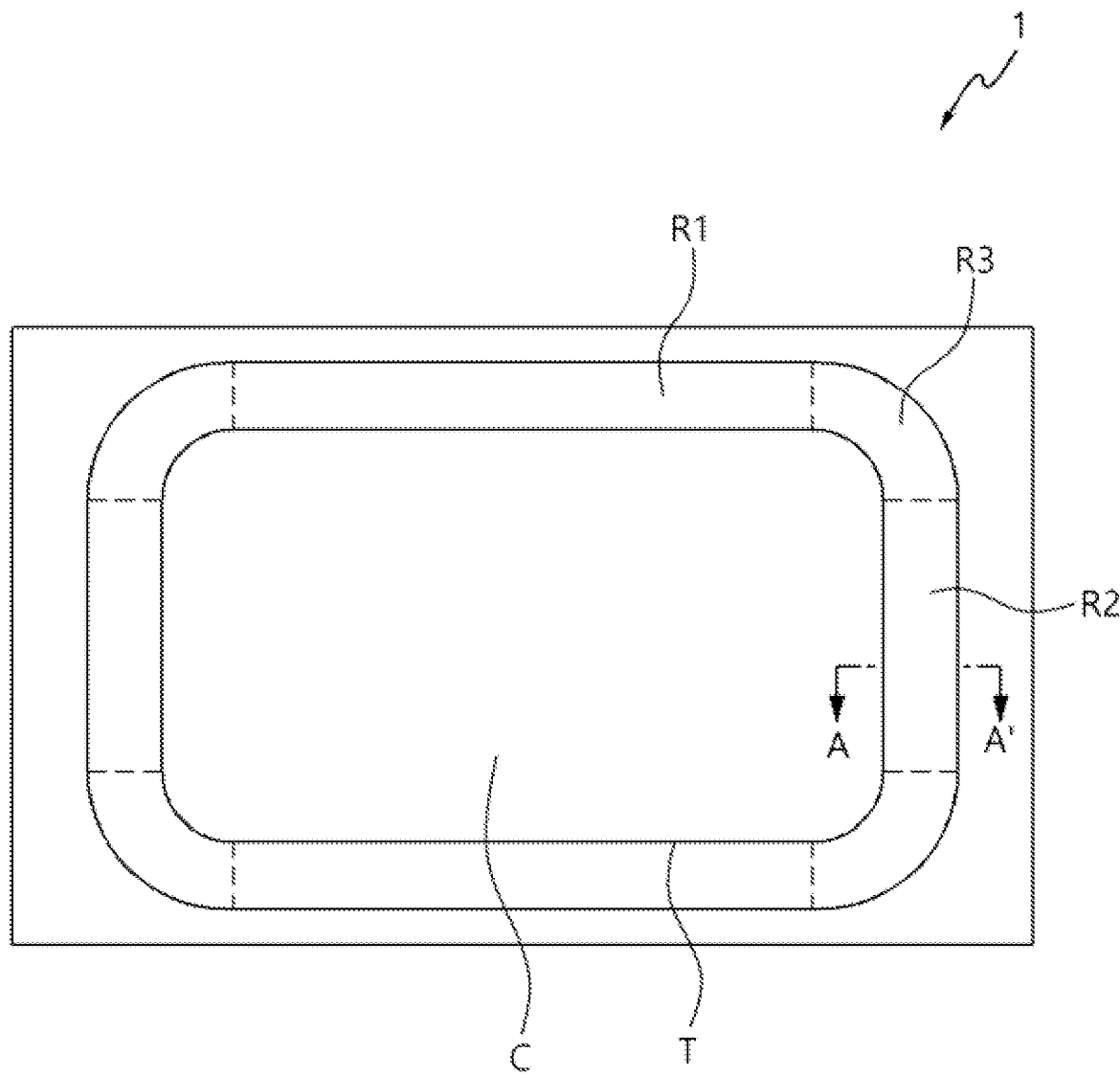
FIG. 3 is a plan view illustrating an exemplary superjunction semiconductor device according to an embodiment of the present disclosure.
Figure 4:
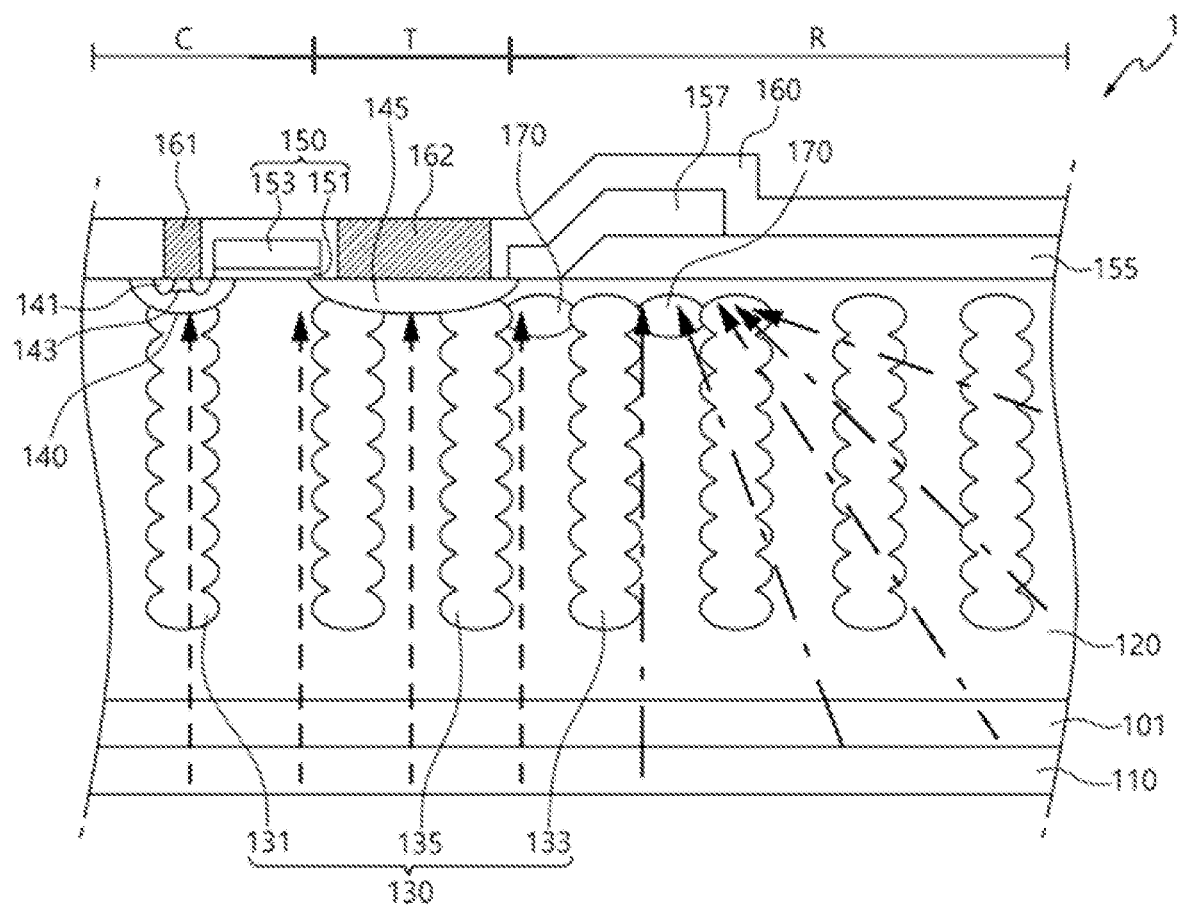
FIG. 4 is a cross-sectional view illustrating the superjunction semiconductor device illustrated in FIG. 3 taken along line A-A'.

FIG. 3 is a plan view illustrating an exemplary superjunction semiconductor device 1 according to an embodiment of the present disclosure. FIG. 4 is a cross-sectional view illustrating the superjunction semiconductor device 1 illustrated in FIG. 3 taken along line A-A'.

Hereinafter, the exemplary superjunction semiconductor device 1 according to the present disclosure will be described in detail with reference to the accompanying drawings.

Before describing the present disclosure in detail, a layout structure of the exemplary superjunction semiconductor device 1 according to the present disclosure will be described.

Referring to FIG. 3, a cell region C serving as an active region is in the center of the superjunction semiconductor device 1, and a ring region R (e.g., including regions R1, R2, and R3) serving as a termination region surrounds the cell region C. Hereinafter, in the ring region R, an area in the first direction is referred to as a first ring (e.g., X) region R1, an area in the second direction is referred to as a second ring (e.g., Y) region R2, and an area where the first ring region R1 and the second ring region R2 are joined or interface with each other is referred to as a ring corner region R3. In addition, a transition region T is between the ring region R and the cell region C.

Referring to FIGS. 3 and 4, the present disclosure relates to the exemplary superjunction semiconductor device 1. More particularly, the present disclosure relates to the exemplary superjunction semiconductor device 1 including an additional structure that enables smooth current flow in the transition region T and/or the ring region R, where the current may concentrate locally during a turn-on and/or turn-off operation of the device 1 due to insufficient current flow or an insufficient number of current paths compared to the cell region C, thereby improving reverse recovery characteristics and reducing or preventing device destruction.

Describing the structure of the device 1 with reference to FIG. 4, a substrate 101 may comprise a silicon substrate, and may further include an epitaxial layer (e.g., of silicon, grown on the silicon substrate). In addition, a drain electrode 110 may be on one major surface of (e.g., under) the substrate 101.

On the substrate 101, an epitaxial layer 120 may be in the cell region C, the transition region T, and the ring region R. The epitaxial layer 120 may comprise, for example, crystalline silicon containing a lightly doped second conductivity type impurity. In addition, a plurality of pillars 130 may be in the epitaxial layer 120. The pillars 130 may be spaced apart from each other along the first direction and may each extend along the second direction. Each of the pillars 130 comprises an impurity region having the first conductivity type and may extend to a predetermined depth in the epitaxial layer 120 from a position adjacent to or below a surface of the epitaxial layer 120 toward the substrate 101. The pillars 130 may alternate with sections of the epitaxial layer 120 along the first direction at a predetermined depth (e.g., in the epitaxial layer 120).

Each of the pillars 130 may have an outer surface extending vertically (e.g., as shown in FIG. 4), or may have a surface in contact with the epitaxial layer 120 that are curved or are complementary to those of the epitaxial layer 120 at the interface therebetween. In addition, the pillars 110 may be in the entire cell region C and the ring region R (e.g., the entire ring region R). Hereinafter, for convenience of explanation, a pillar 130 in the cell region C is referred to as a "first pillar 131", a pillar 130 in the ring region R is referred to as a "second pillar 133", and a pillar 130 in the transition region T is referred to as a "third pillar 135". In general, the pillars 130 crossing the cell region C also cross both the ring region R and the transition region T. Accordingly, the first to third pillars 131, 133, and 135 are only for convenience of description of the pillars 130 in the cross-sectional view. For example, the first pillars 131 may extend along the second direction and may cross both the transition region T and the ring region R.

In the cell region C, a first body region 140 may be at a surface of the epitaxial layer 120. The first body region 140 may comprise an impurity region having the first conductivity type. In addition, a plurality of first body regions 140 may be in the cell region C. The first body regions 140 may be spaced apart from each other along the first direction, and each of the first body regions 140 may be electrically connected to corresponding ones of the pillars 130 (e.g., at an upper surface or portion thereof). In addition, a source 141 and a body contact 143 may be in each of the first body regions 140. The source 141 and the body contact 143 may be at the surface of the epitaxial layer 120, and may be adjacent to or overlapping each other. The source 141 may comprise a heavily doped impurity region having a second conductivity type, and the body contact 143 may comprise a heavily doped impurity region having the first conductivity type. In addition, one or two sources 141 may be in each of the first body regions 140, but are not limited thereto.

In the transition region T, a second body region 145 may be in the epitaxial layer 120 (e.g., at the surface thereof). Like the first body region 140, the second body region 145 may comprise an impurity region having the first conductivity type, and may be electrically connected to respective pillars 130 (e.g., at an upper surface or portion thereof) in the transition region T. In other words, the pillars 130 in the transition region T may share the second body region 145 along the first direction. The second body region 145 may comprise a plurality of second body regions 145 spaced apart from each other along the extension direction of the transition region T in the plan view, or may comprise a single, integral second body region 145, but is not limited thereto.

In addition, in the cell region C and the transition region T, a gate insulating layer 151 may be on the epitaxial layer 120, and a gate electrode 153 may be on the gate insulating layer 151. The gate insulating layer 151 may comprise, for example, a silicon oxide layer, a high-k dielectric layer (e.g., hafnium oxide, hafnium silicate, zirconium oxide, or zirconium silicate, which may or may not be nitrided), or a combination thereof, but is not limited thereto. The gate electrode 153 may comprise, for example, polysilicon, a metal, a conductive metal nitride, a conductive metal silicide, or a combination thereof, but is not limited thereto. The gate 150 includes the gate insulating layer 151 and the gate electrode 153. A plurality of gates 150 may be spaced apart from each other along the first direction and may each extend along the second direction. In other words, the gates 150 may have a stripe shape with the pillars 130 interposed therebetween in the cell region C and, if necessary or desired, also in the transition region T. In addition, in the ring region R, a field oxide layer 155 may be on the epitaxial layer 120, and a gate runner 157 may be on the field oxide layer 155.

In addition, an interlayer insulating layer 160 may be on the epitaxial layer 120 and covering the gate electrode 153 and the gate runner 157. The interlayer insulating layer 160 may comprise, for example, a silicon oxide (e.g., doped or undoped silicon dioxide) layer, but is not limited thereto. In addition, a first contact 161 and a second contact 162 may be on the epitaxial layer 120 and in or through the interlayer insulating layer 160. The first contact 161 may be on a corresponding one of the first body regions 140 in the cell region C to serve as a source contact. In addition, a second contact 162 may be on the second body region 145 in the transition region T. Both the first contact 161 and the second contact 162 may include, for example, a conductive metal such as tungsten (W) and/or a conductive material such as titanium nitride (TiN), but are not limited thereto.

Hereinafter, the structure of a superjunction semiconductor device 9 according to the related art and the problems thereof, and a novel structure according to embodiments of the present disclosure for solving the problems will be described.

Referring to FIG. 1, in the superjunction semiconductor device 9 according to the related art, a plurality of pillars 920 are in an epitaxial layer 910 from a cell region C to a ring region R. The pillars 920 are spaced apart from each other. In addition, a first body region 930 is electrically connected to an upper portion of each of the pillars 920 in the cell region C. A source contact 940 is on each first body region 930. Each source contact 940 provides a current path during a switching operation of the device 9. However, in a transition region T, since the contact 942 is on only the second body region 932, and the second body region 932 is shared by a plurality of pillars 920 in the transition region T, the number of second body regions 932 is relatively small compared to the number of first body regions 930 in the cell region C. This means that the number of contacts 942 is smaller than that of the source contacts 940. In addition, no separate contact is in the ring region R.

Thus, while the current in the cell region C can flow through a plurality of current paths (that is, using respective source contacts 940), the current in the transition region T and the ring region R flow through relatively limited current paths (that is, using a limited number of contacts 942), so the current inevitably concentrates locally on or in the contacts 942. This is a major cause of defects and device destruction.

Figure 2:
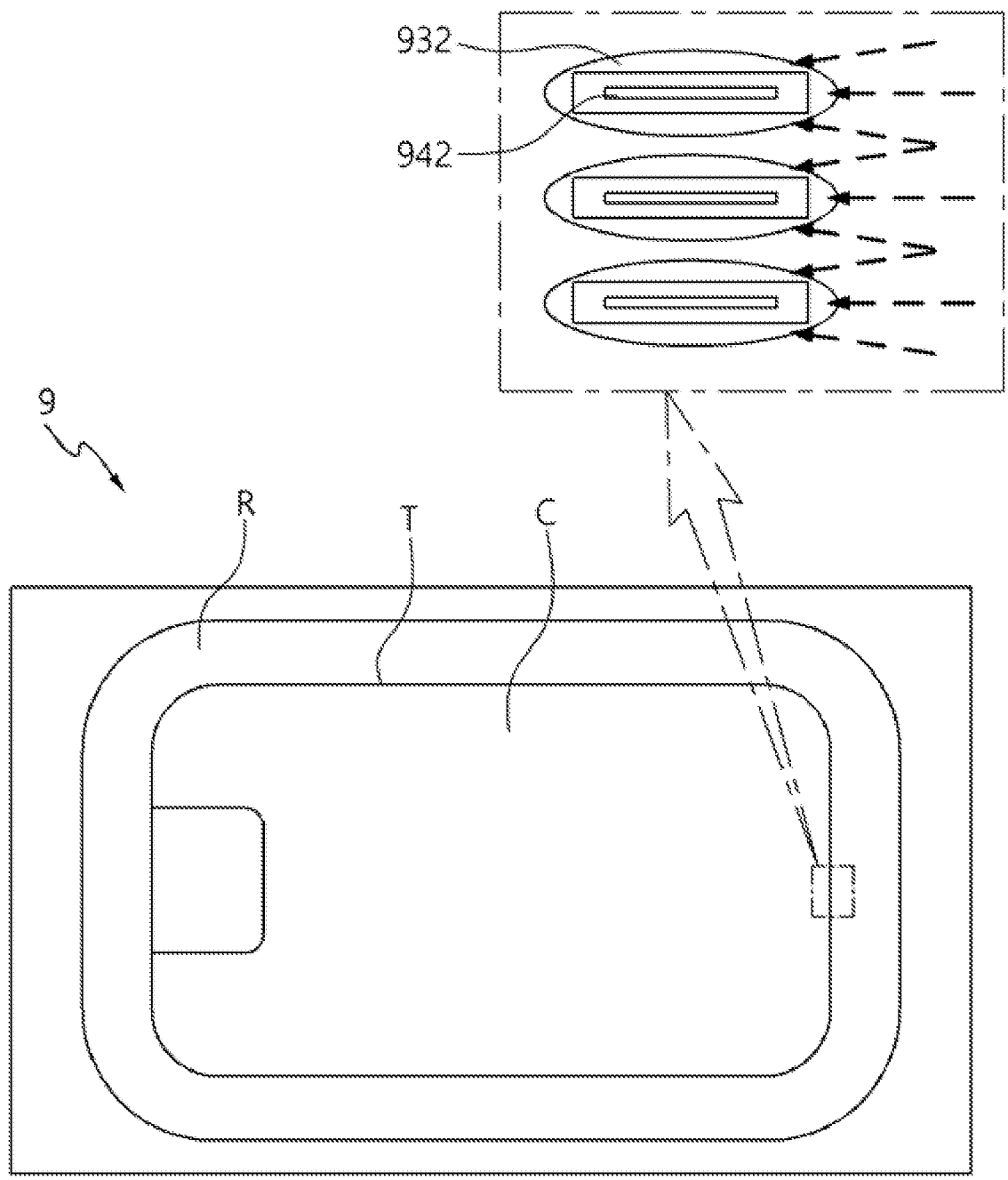
FIG. 2 is a plan view illustrating the superjunction semiconductor device illustrated in FIG. 1.

Also, referring to FIG. 2, in the superjunction semiconductor device 9 according to the related art, a plurality of second body regions 932 are spaced apart from each other along the extension direction of the transition region T. Since the contact 942 is not in the space between adjacent second body regions 932, the contact 942 is in a limited area of the transition region T. Therefore, the contact 942 corresponding to each of the second body regions 932 in the limited area of the transition region T may be insufficient to handle current flow in the transition region T during switching of the device 9. This is the main factor that limits smooth flow of current.

In order to solve the above problems, referring to FIG. 4, the superjunction semiconductor device 1 according to the present disclosure is characterized by including a connector 170 that connects the second pillar 133 and the third pillar 135 in the boundary area between the transition region T and the ring region R, and if necessary or desired, connects adjacent second pillars 133 (e.g., at their respective upper portions) close to the boundary area. The connector 170 may comprise an impurity region having the first conductivity type, like the second pillar 133, and may connect the second pillar 133 and the third pillar 135 to each other and specific and/or adjacent second pillars 133 to each other. For example, the connector 170 may connect adjacent second pillars 133 spaced apart from each other in the first direction in the ring region R, and may connect adjacent second and third pillars 133 and 135 in the boundary area between the transition region T and the ring region R.

Preferably, the connector 170 connects respective uppermost ends of the second pillar(s) 133 and respective uppermost ends of the second and third pillars 133 and 135. More preferably, the connector 170 extends in the epitaxial layer 120 to a depth of less than half that of each of the pillars 130. In addition, the connector 170 is preferably only between adjacent second pillars 133 in the ring region R, in an area close to the transition region T, and more preferably in the boundary area between the transition region T and the ring region R. In other words, it is not necessary for the connector 170 to connect all the second pillars 133, including those in an end area of the ring region R. As the connector 170 electrically connects the pillars 130 to each other as described above, a PN junction area of the pillars 130 increases to enable smooth current flow. In other words, reverse recovery characteristics may improve.

Figure 5:
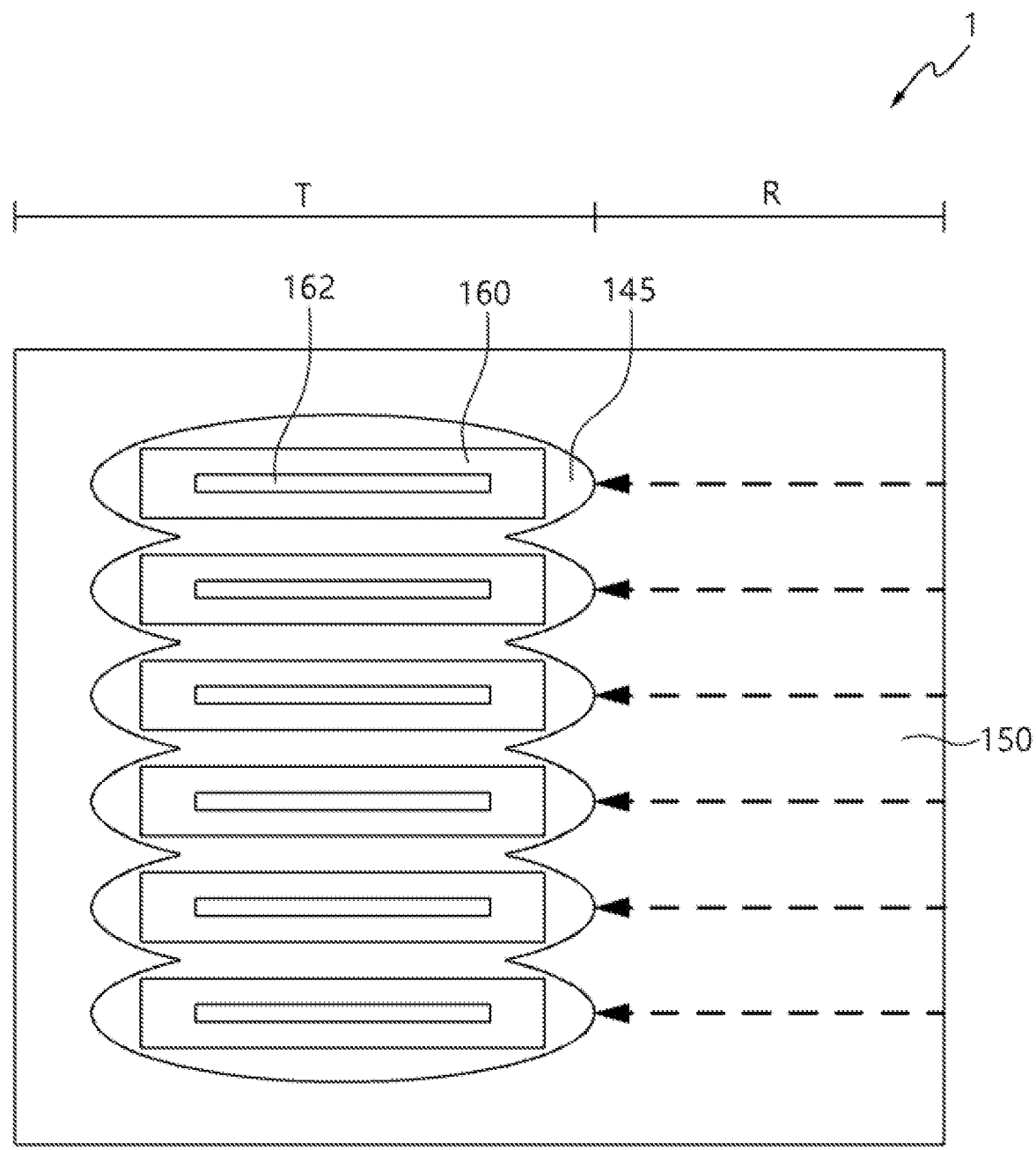
FIG. 5 is a plan view illustrating an exemplary boundary area between the transition region and the ring region of the superjunction semiconductor device according to an embodiment of the present disclosure.

FIG. 5 is a plan view illustrating the boundary area between the transition region T and the ring region R of the superjunction semiconductor device 1 according to an embodiment of the present disclosure.

Referring to FIG. 5, adjacent second body regions 145 may be integrally and/or electrically connected to each other along the extension direction of the transition region T in the plan view. In other words, the second body region 145 may be continuous along the extension direction in the transition region T. For example, the second body region 145 may have a shape (e.g., a "band" shape) in the plan view like the transition region T. Alternatively, the transition region T may have an area in which adjacent second body regions 145 are spaced apart from each other. In such a configuration, separation space may or may not exist between the second body regions 145, so that the second contacts 162 may be denser than in the conventional device 9. Alternatively, considering that the area containing the second contacts 162 increases because the second body regions 145 are electrically connected to each other, the second contacts 162 may be wider than those in the conventional device 9, thereby enabling distribution of current concentration.

Figure 6:
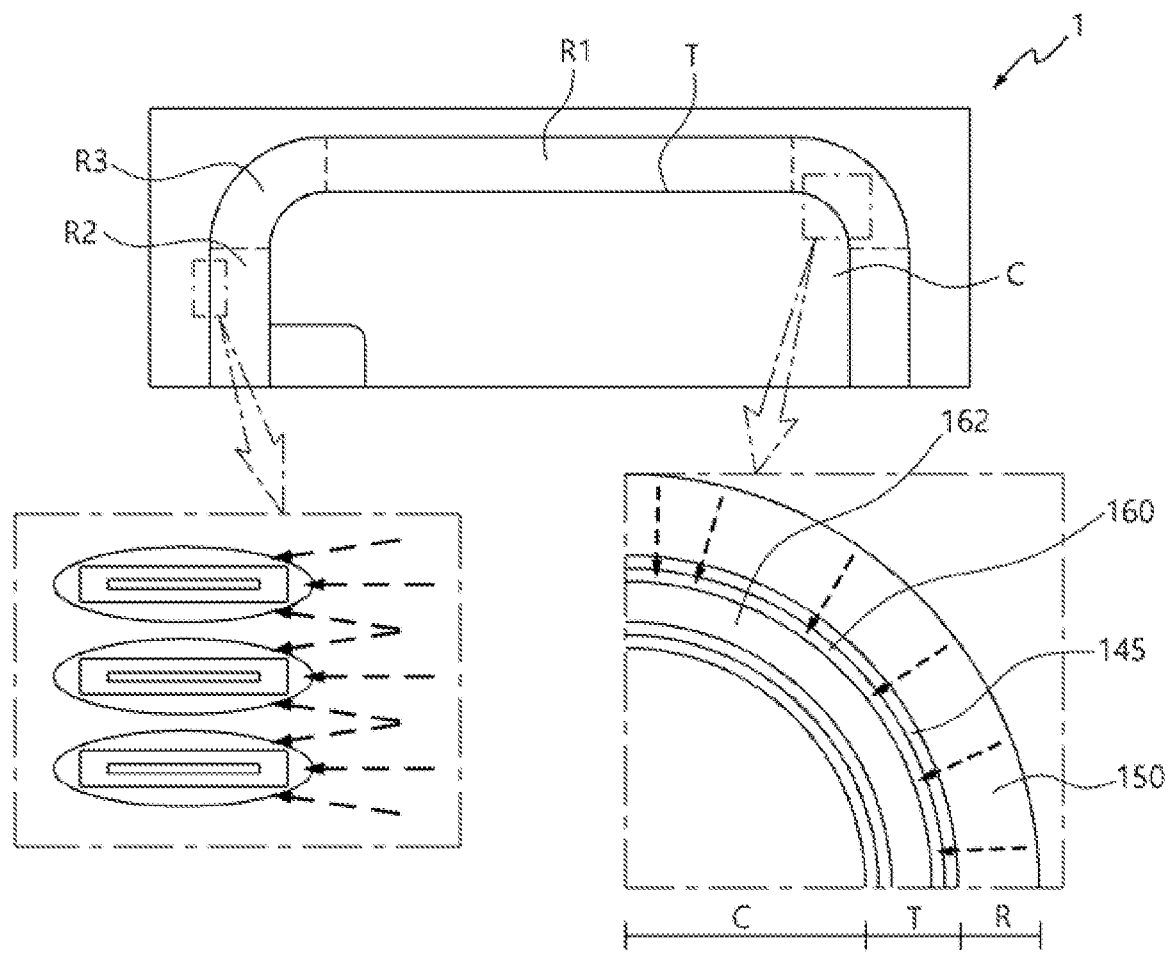
FIG. 6 is a plan view illustrating first and second boundary areas respectively of the ring region and between the transition region and the ring region of the superjunction semiconductor device according to the present disclosure.
Figure 7:
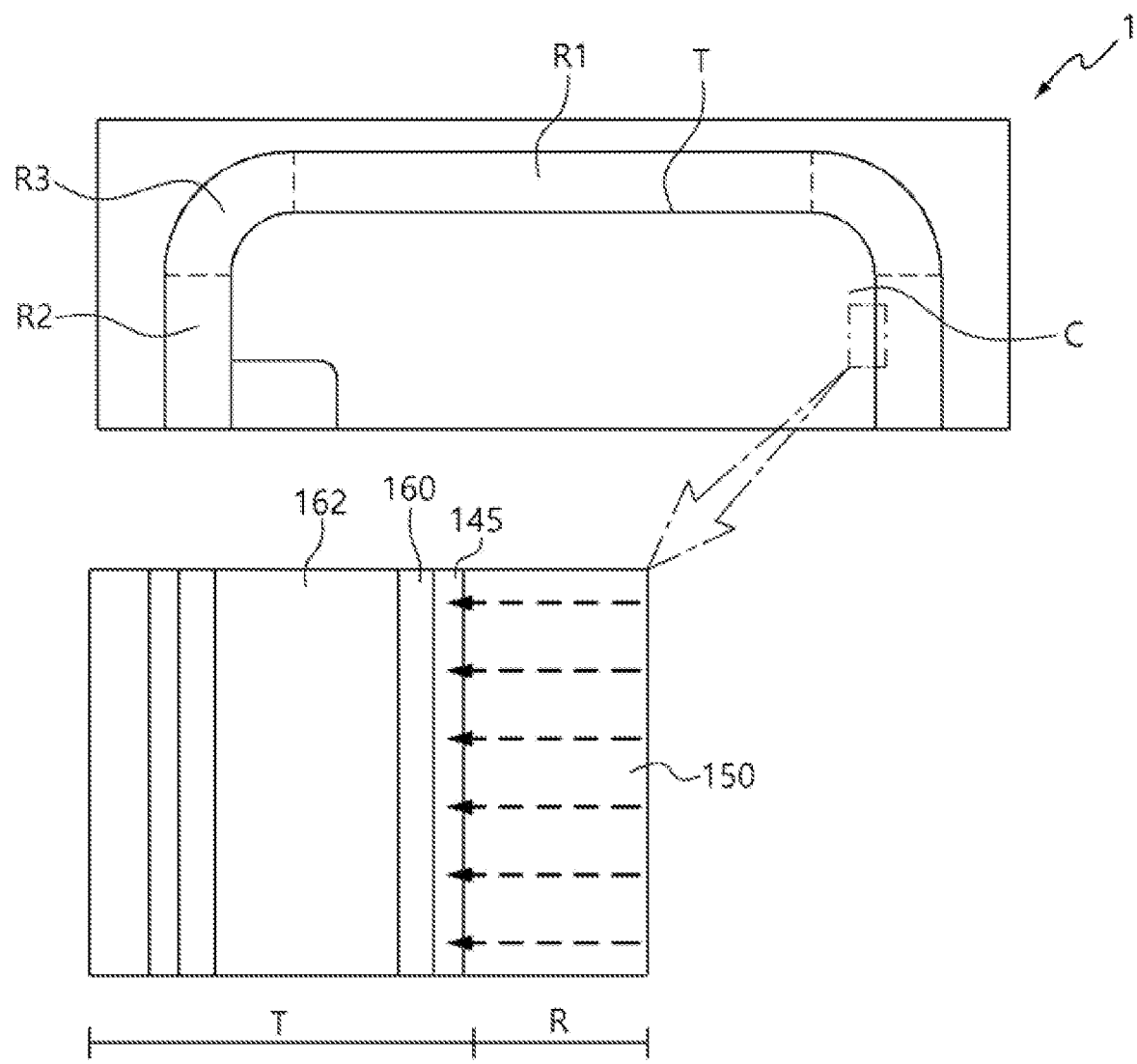
FIG. 7 is a plan view illustrating a third boundary area between the transition region and the ring region of the superjunction semiconductor device according to the present disclosure.

FIG. 6 is a plan view illustrating boundary areas of the ring region R and between the transition region T and the ring region R in the superjunction semiconductor device 1 according to the present disclosure. FIG. 7 is a plan view illustrating a different boundary area between the transition region T and the ring region R of the superjunction semiconductor device 1 according to the present disclosure.

One second body region 145 may be continuous in the transition region T along the extension direction of the transition region T. Similarly, one second contact 162 may also be continuous in the transition region T. In other words, the second contact 162 may be in a shape (e.g., a band shape) in the plan view extending along the extension direction of the transition region T. In this case, no gate 150 may be in the transition region T. Alternatively, the second body region 145 and the second contact 162 may be continuous only in a corner area of the transition region T (e.g., adjacent to the ring corner region R3). For example, referring to FIG. 6, the second contact 162 may be spaced apart from an adjacent second contact 162 in the transition region T in an area close to the ring region R1 and the ring region R2, and may be integrally and/or electrically connected to an adjacent second contact 162 in the transition region T in an area close to the ring corner region R3. In other words, the second contact 162 may extend along the extension direction of the transition region T in the plan view only in the corner area of the transition region T.

Here, it should be understood that the "ring X region" means opposite areas of the band-shaped ring region R in the first direction, the "ring Y region" means opposite areas thereof in the second direction, and the "ring corner region" means a corner area thereof between the ring X region and the ring Y region.

Referring to FIG. 7, a second contact 162 may be continuous outside of the corner areas of the transition region T (e.g., adjacent to the ring region R2 and/or the ring region R1).

Figure 8:
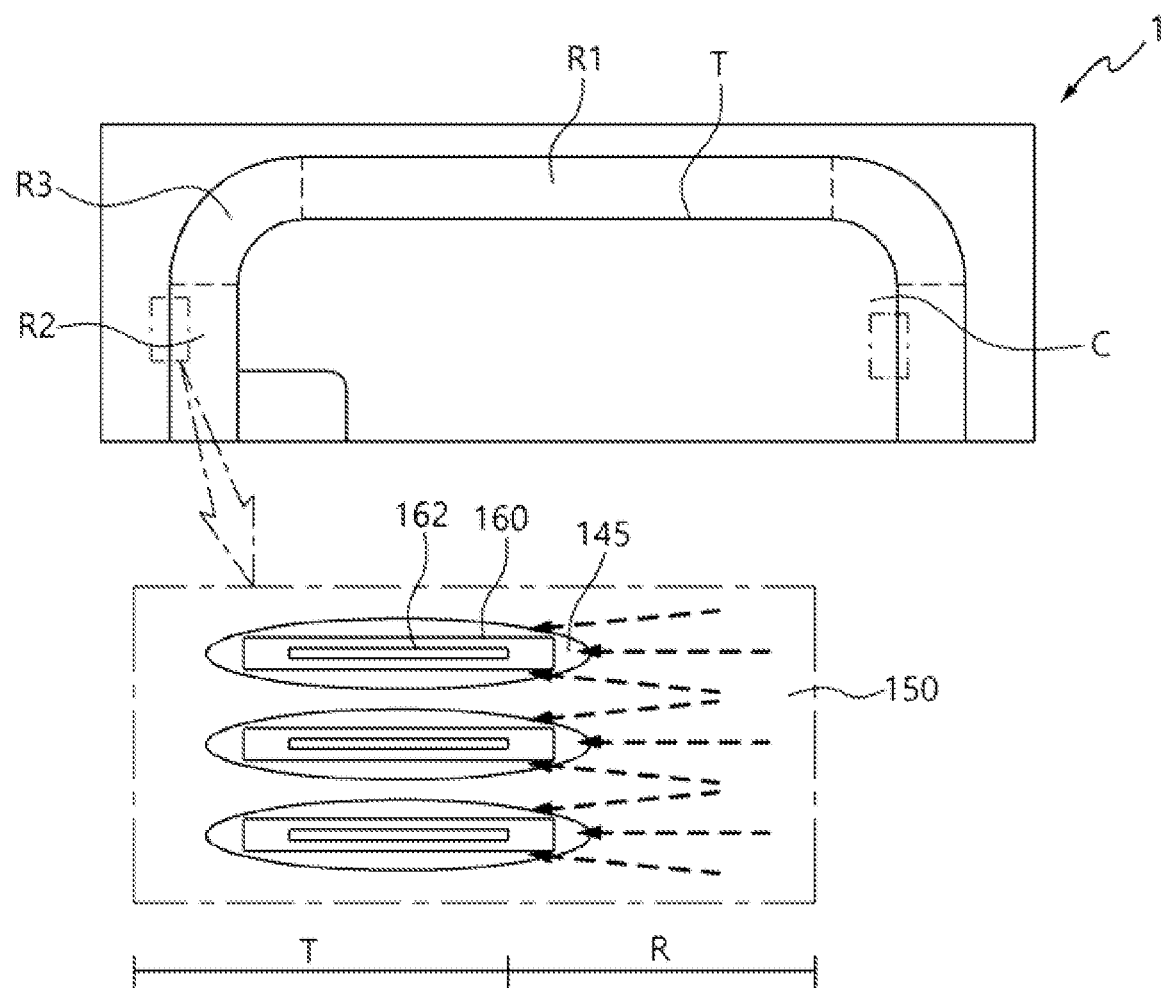
FIG. 8 is a plan view illustrating the first boundary area of the ring region of the superjunction semiconductor device according to the present disclosure.

FIG. 8 is a plan view illustrating a boundary area between a transition region T (e.g., an outermost transition region) and a ring region R of a superjunction semiconductor device 1 according to the present disclosure.

Referring to FIG. 8, adjacent second body regions 145 may be spaced apart from each other. Here, each of the second body regions 145 may extend to the boundary between the ring region R and the (outermost) transition region T or, if necessary, may extend to the ring region R, thereby enabling smooth current flow.

FIGS. 9 to 20 are cross-sectional views illustrating a method of manufacturing a superjunction semiconductor device according to an embodiment of the present disclosure.

Hereinafter, a method of manufacturing a superjunction semiconductor device according to an embodiment of the present disclosure will be described in detail with reference to the accompanying drawings.

Figure 9:
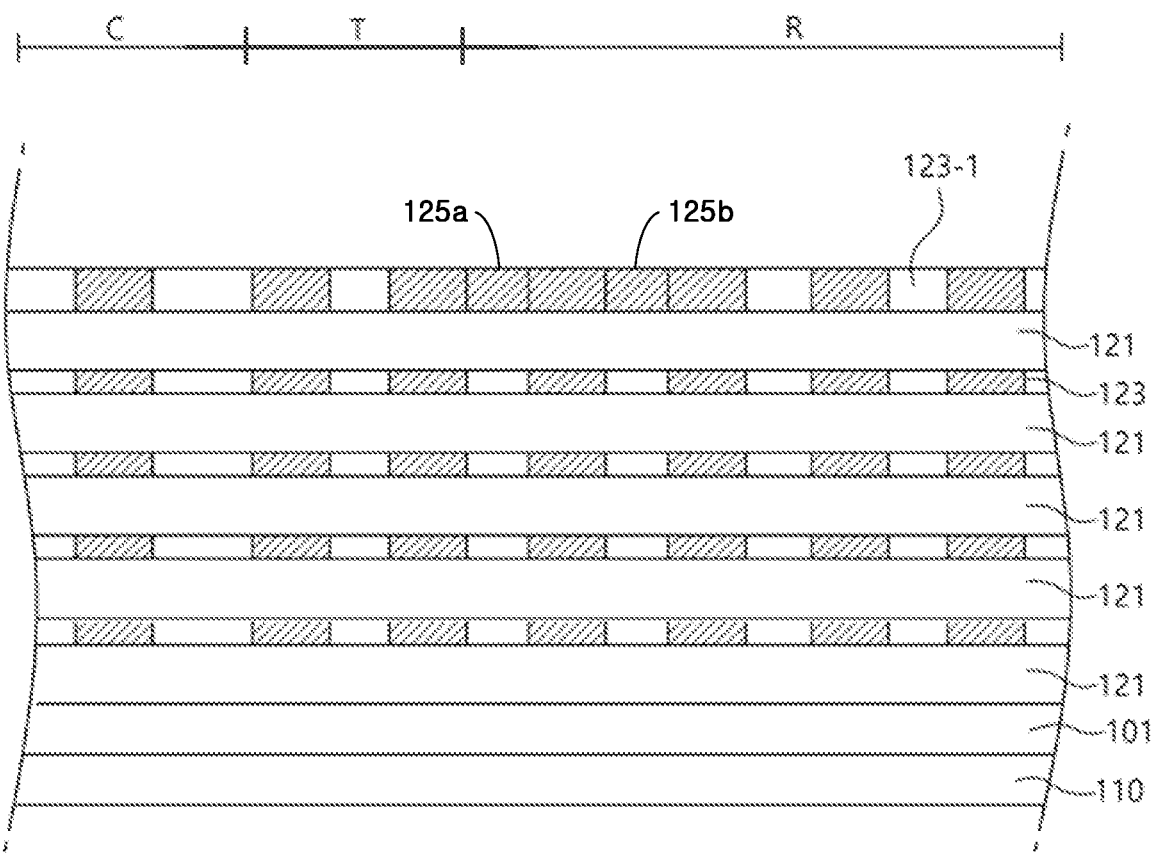
FIGS. 9 to 20 are cross-sectional views illustrating a method of manufacturing a superjunction semiconductor device according to one or more embodiments of the present disclosure.

First, a plurality of pillars 130 may be formed in an epitaxial layer 120. In other words, first to third pillars 131, 133, and 135 may be formed in the cell region C, the transition region T, and the ring region R. The formation of the pillars 130 will be described in detail. Referring to FIG. 9, for example, a plurality of epitaxial layers 121 having the second conductivity type may be formed in sequence, and an implant layer 123 having the first conductivity type may be formed in a predetermined region in each of the epitaxial layers 121. In addition, first conductivity type impurities may also be implanted into an area of an upper implant layer(s) 123, including regions 125a-b in an uppermost implant layer 123-1, the area and/or layer corresponding to the position of the connector 170.

Figure 10:
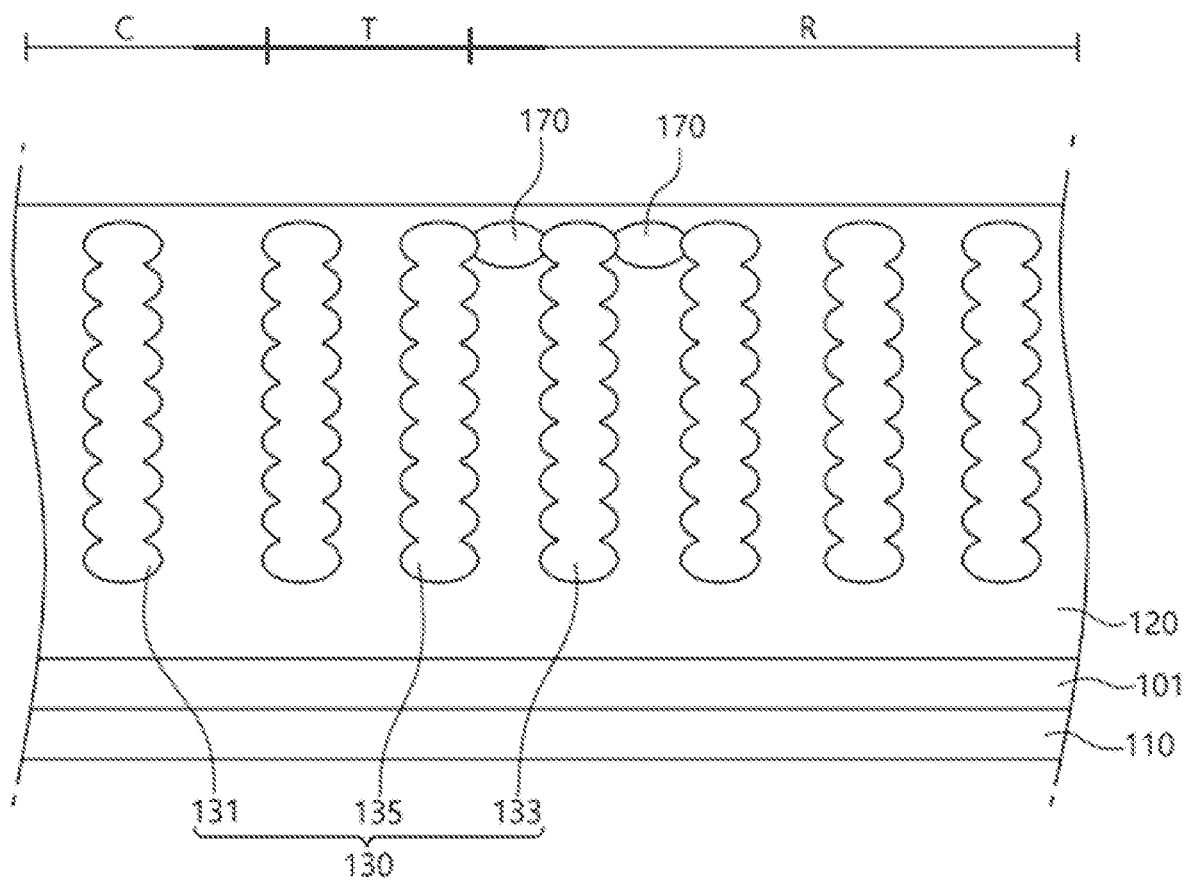
Figure 11:
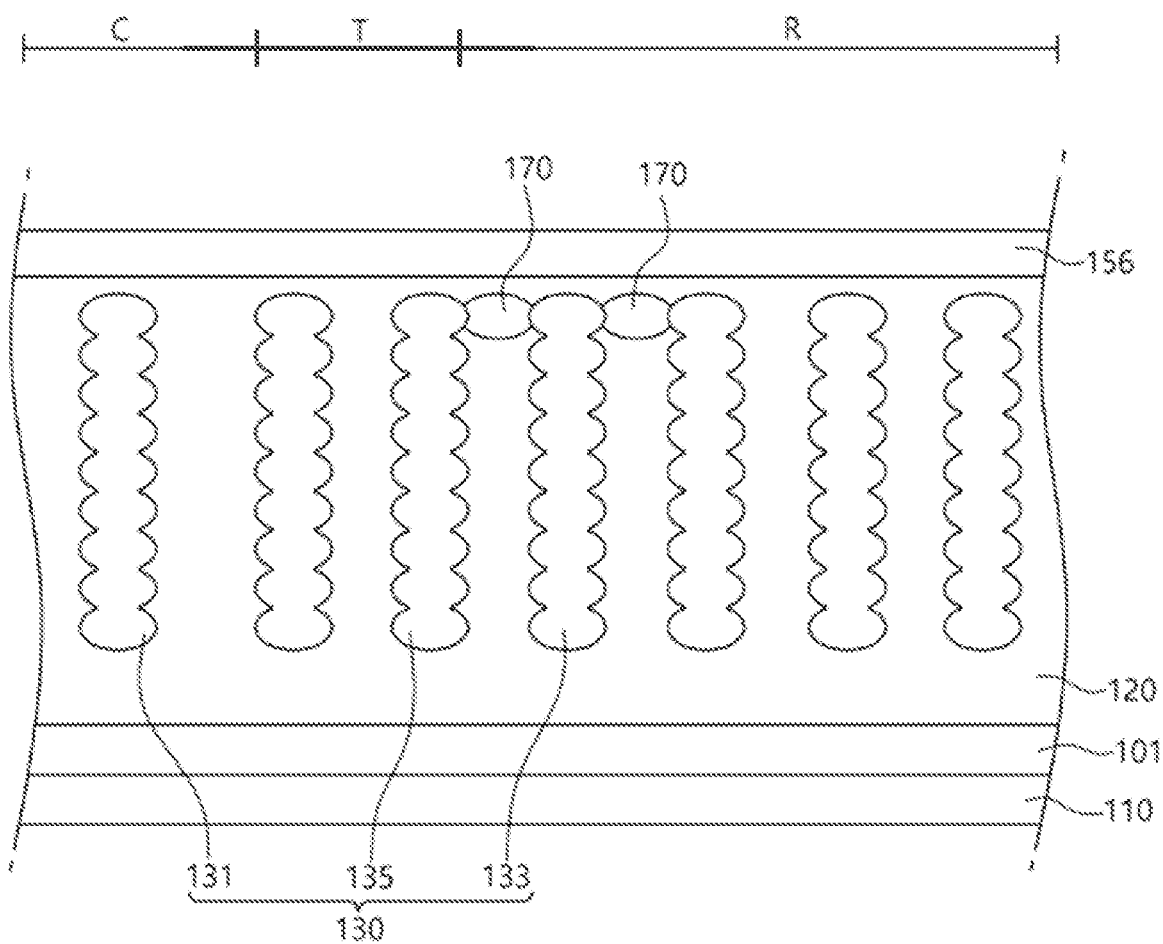
Figure 12:
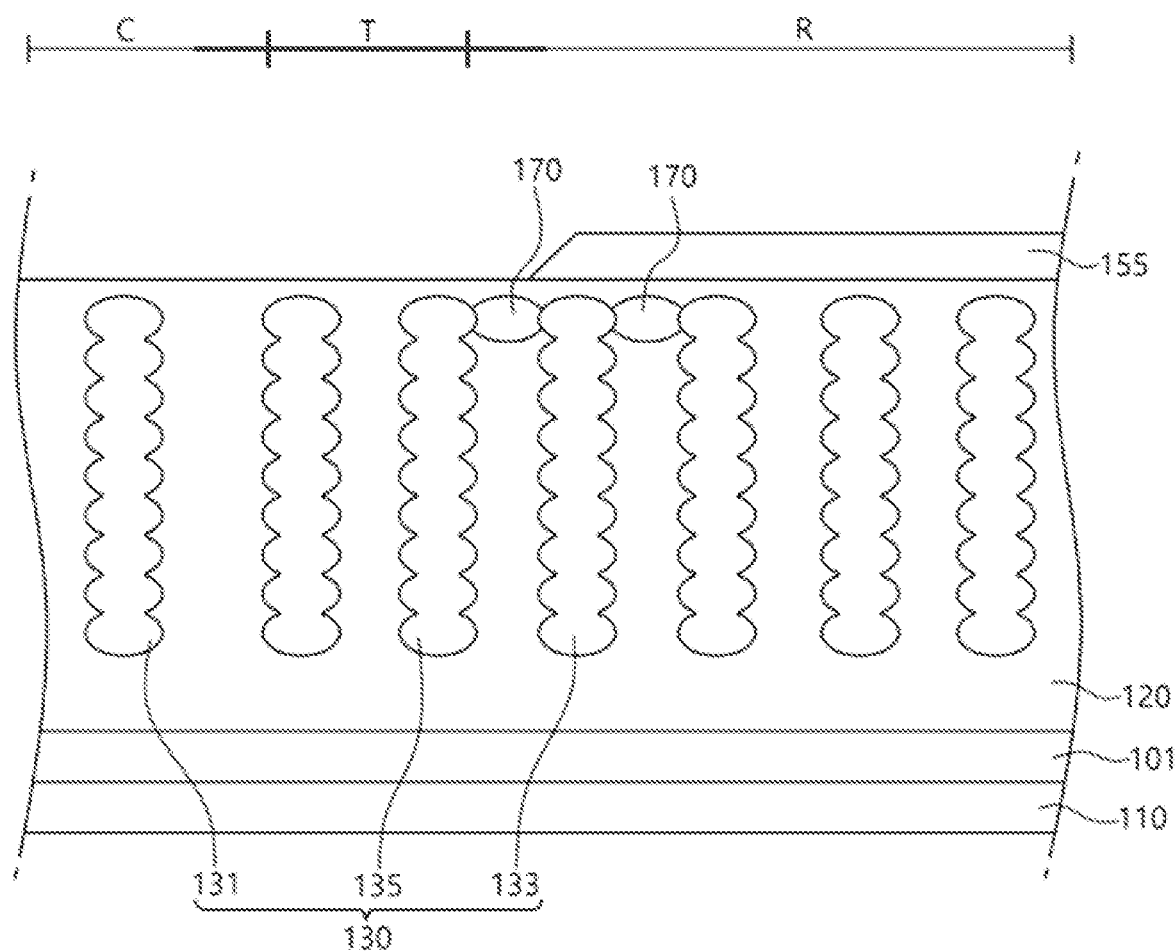

Then, referring to FIG. 10, after growth of a final epitaxial layer (not identified) without subsequent implantation of first conductivity type impurities, the pillars 130 and the connector 170 may be formed by diffusion (e.g., heat treatment at a temperature sufficient to diffuse and optionally activate the impurities in the epitaxial layer 120 and the pillars 130). The pillars 130 and the connector 170 may be formed after forming a trench in the epitaxial layers 120, but is not limited thereto.

Then, a gate insulating layer 151, a gate electrode 153, a field oxide layer 155, and a gate runner 157 may be formed. For example, referring to FIG. 11, an oxide layer 156 may be formed on the epitaxial layer 120. Then, referring to FIG. 12, following photolithographic patterning of a photoresist (not shown), an exposed area of the field oxide layer 156 (e.g., in the cell region C and the transition region T) may be etched to form the patterned the field oxide layer 155.

Figure 13:
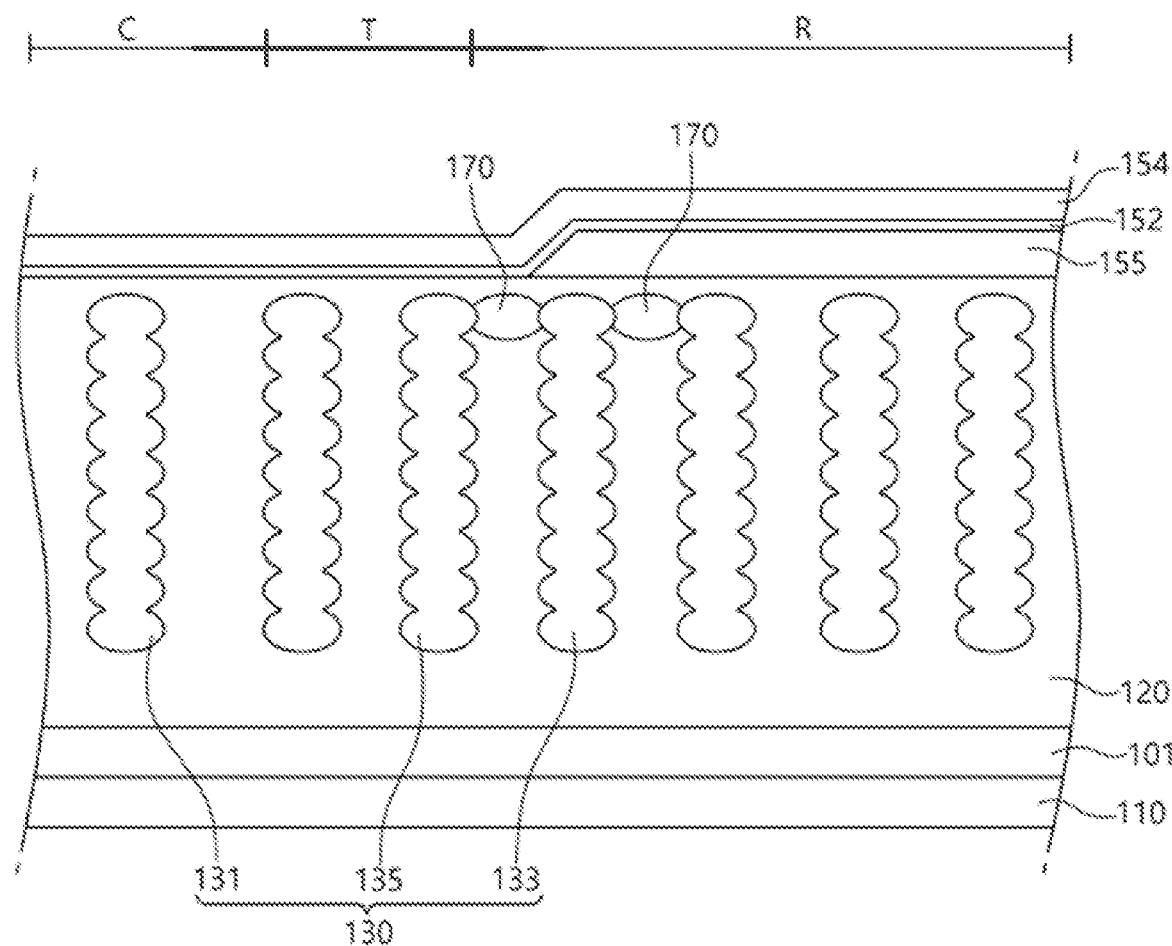
Figure 14:
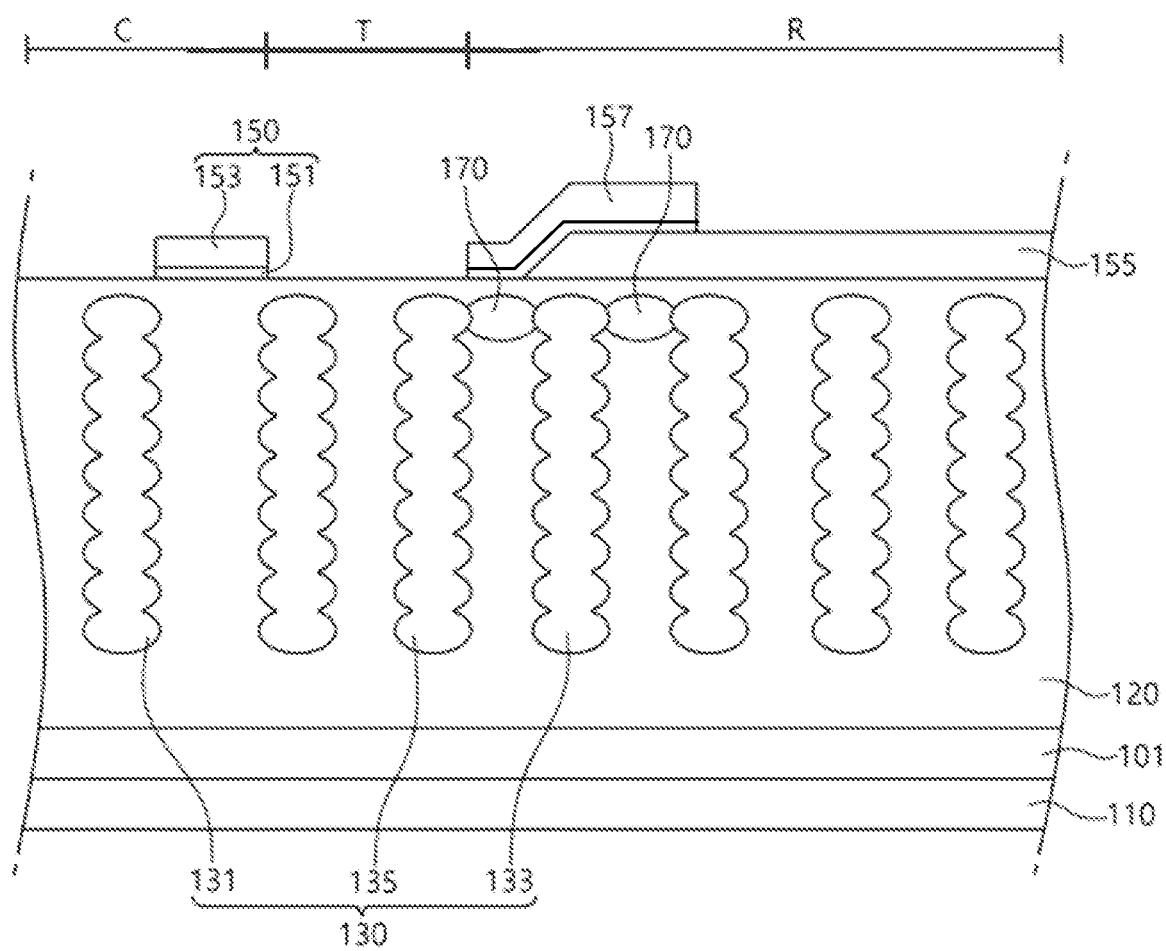

Then, referring to FIG. 13, an insulating layer 152 may be deposited on the epitaxial layer 120 and the field oxide layer 155 (or thermally grown on the exposed epitaxial layer 120 in an oxidizing environment or atmosphere), and a polysilicon layer 154 may be deposited on the insulating layer 152. Then, referring to FIG. 14, following photolithographic patterning of a photoresist (not shown), exposed areas of the gate insulating layer 151, the gate electrode 153, and the gate runner 157 may be etched. After removal of the patterned photoresist, the gate insulating layer 151, the gate electrode 153, the field oxide layer 155, and the gate runner 157 may all be formed.

Figure 15:
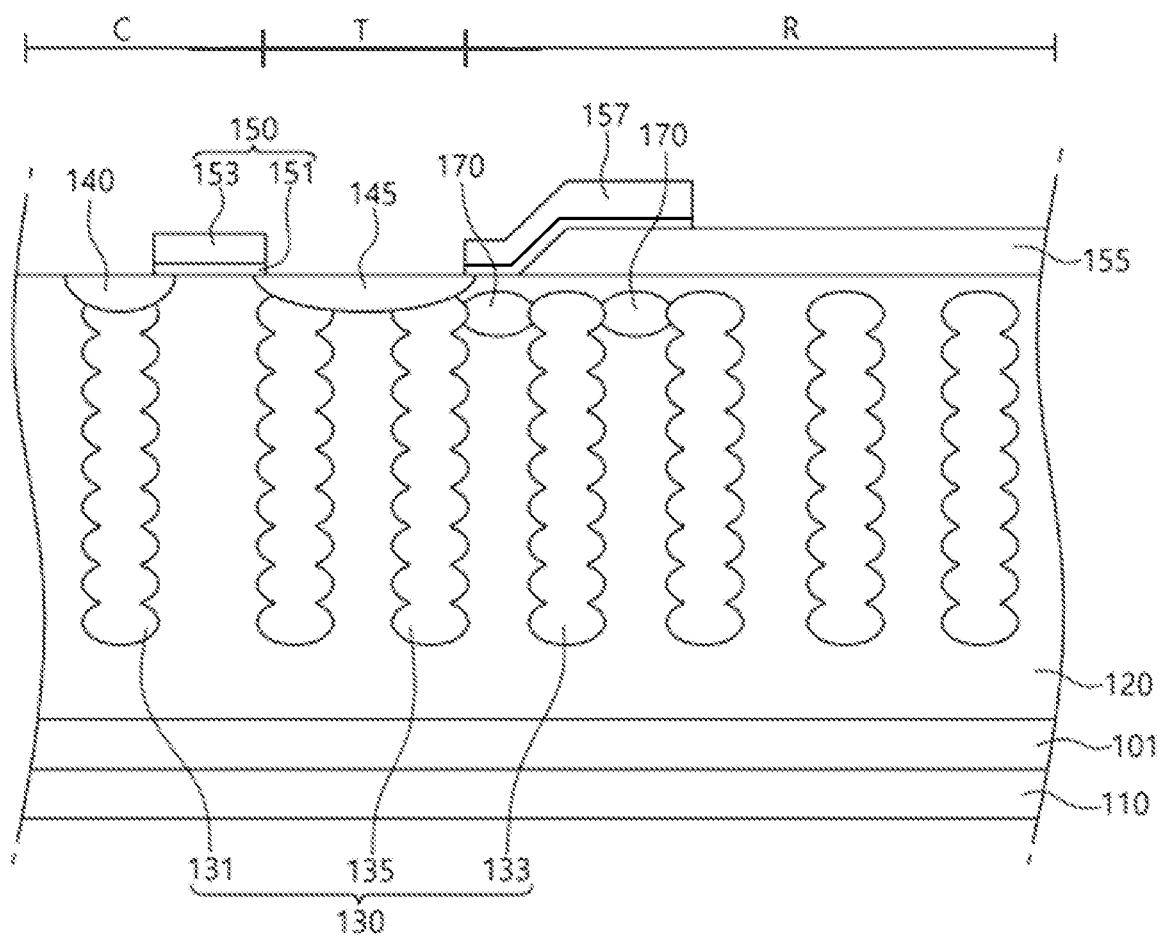

Then, referring to FIG. 15, a first body region 140 and a second body region 145 may be formed. In detail, for example, the first body region 140 and the second body region 145 may be formed by implanting first conductive type impurities into the epitaxial layer 120 using the gates 150 in the cell region C and the gate runner 157 in the transition region T as a mask. As described above, one second body region 145 may be formed in the transition region T along the extension direction of the transition region T in the plan view of the device. When the second body region 145 is continuous as described above, the formation thereof may be achieved by making the distance between adjacent gate electrodes 153 relatively short.

Figure 16:
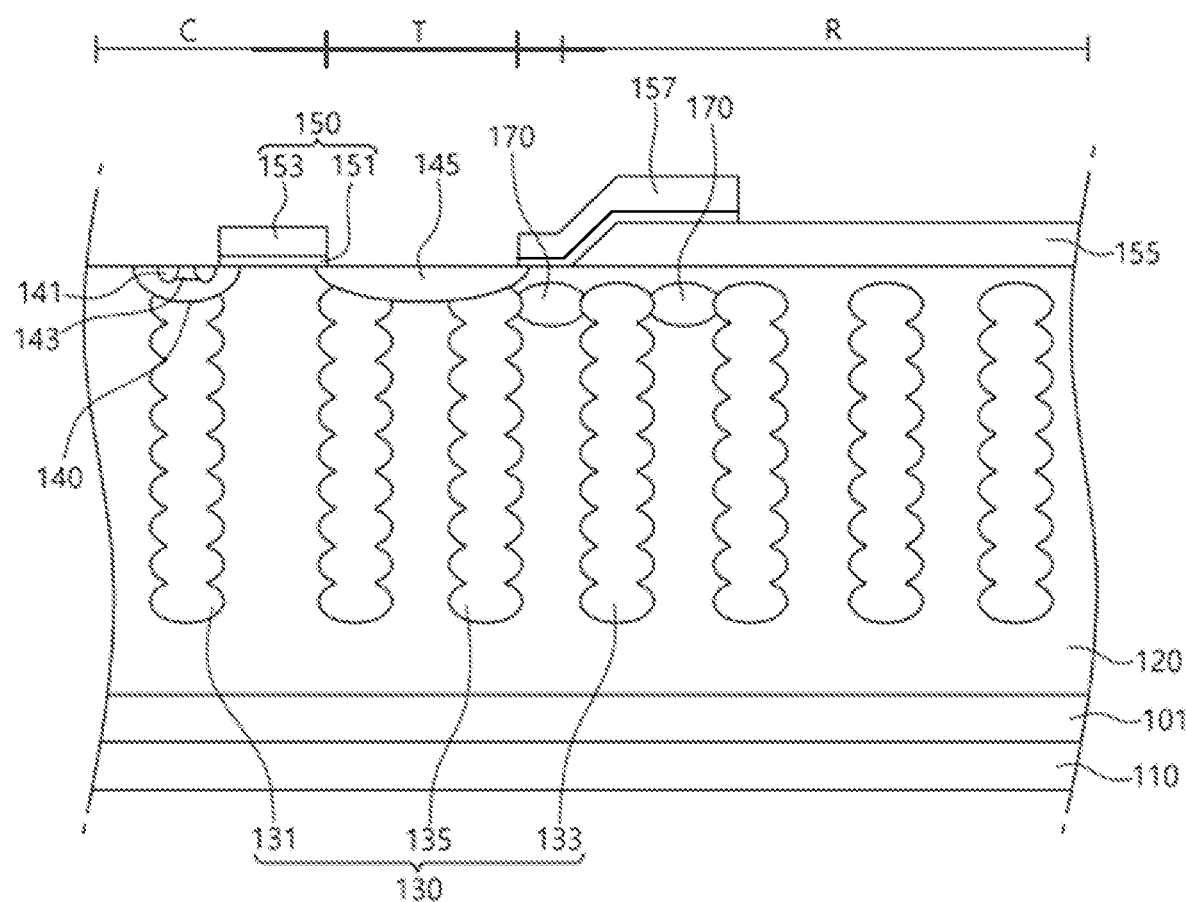

Then, referring to FIG. 16, a source 141 and a body contact 143 may be formed in the first body region 140. The source 141 and the body contact 143 may be formed by implanting second conductivity type impurities into the first body region 140 first and then implanting first conductivity type impurities into the first body region 140.

Figure 17:
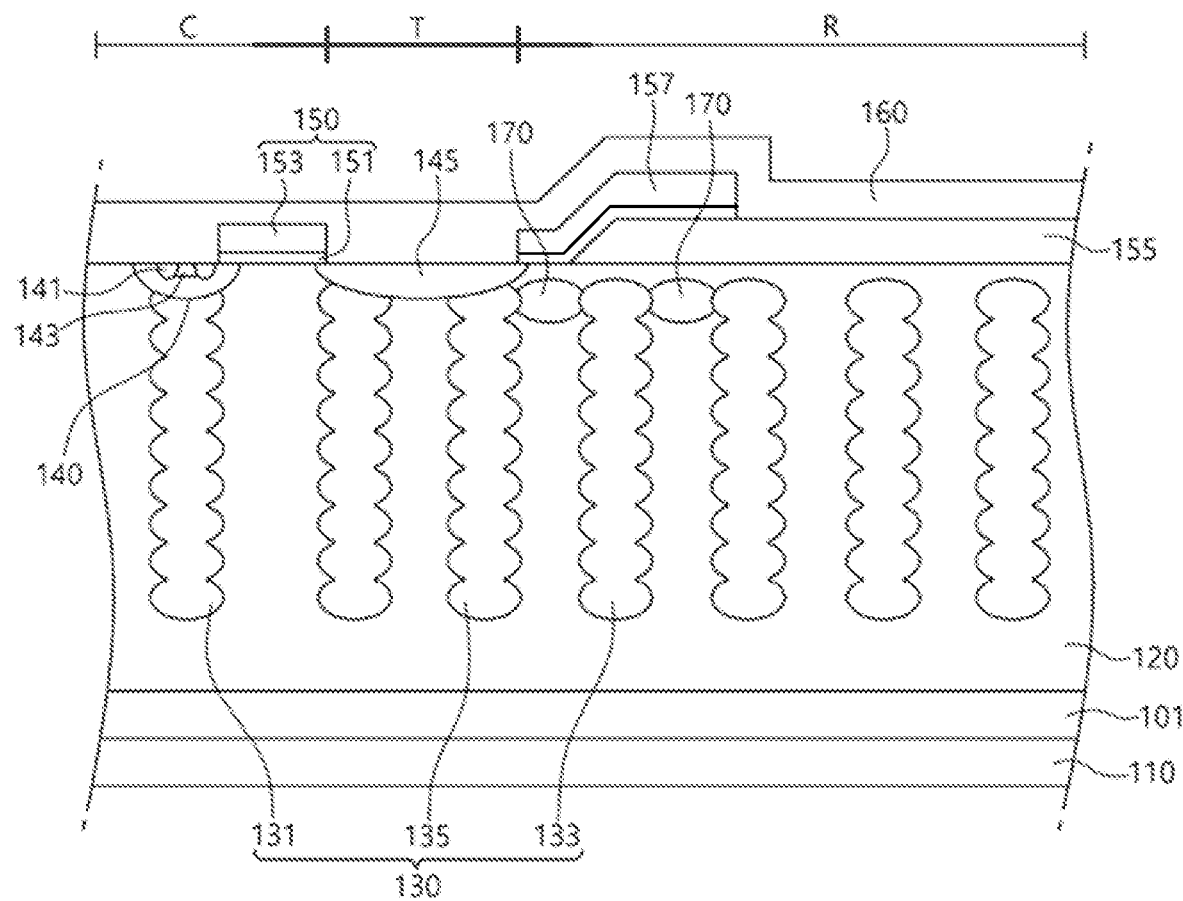
Figure 18:
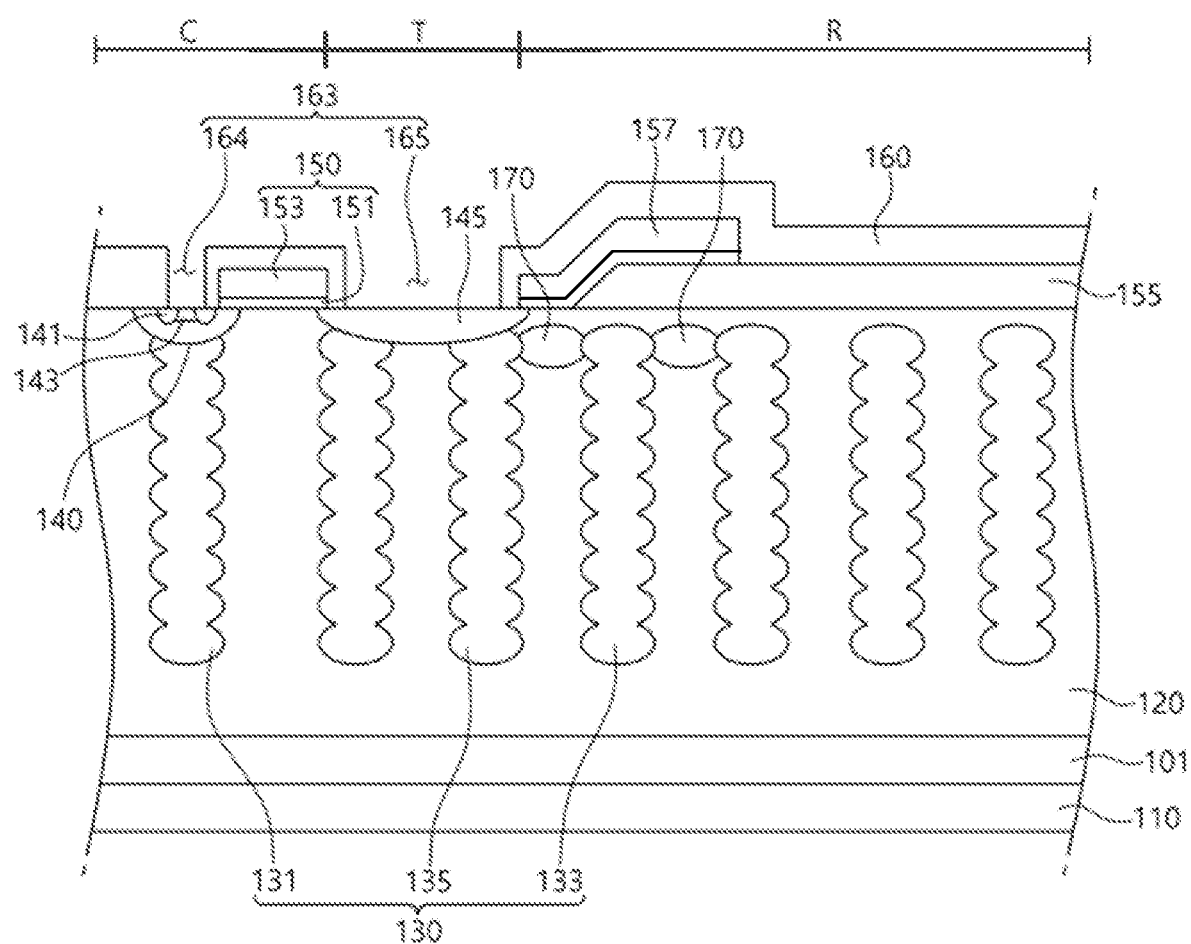

Then, referring to FIG. 17, an interlayer insulating layer 160 may be deposited on the epitaxial layer 120, the gates 150, the field oxide layer 155, and the gate runner 157. Then, contact holes 163 may be formed in the deposited interlayer insulating layer 160. Referring to FIG. 18, the contact holes 163 may be formed by photolithographically patterning a photoresist (not illustrated) on the interlayer insulating layer 160, and then etching areas of interlayer insulating layer 160 exposed by the mask pattern. The contact holes 163 may include a first contact hole 164 in the cell region C and a second contact hole 165 in the transition region T. The second contact hole 165 may be, for example, a single, continuous band-shaped hole 165 in the transition region T along the extension direction of the transition region Tin the plan view, or as a plurality of second contact holes 165 spaced apart from each other (e.g., in a horizontal direction), but is not limited thereto. For example, the second contact hole 165 in at least one corner area of the transition region T may have a shape conforming to the corner area. Alternatively, the second contact hole 165 may extend to the boundary between the transition region T and the ring region R or, if necessary, a side extending to the ring region R, or may have a wide width.

Figure 19:
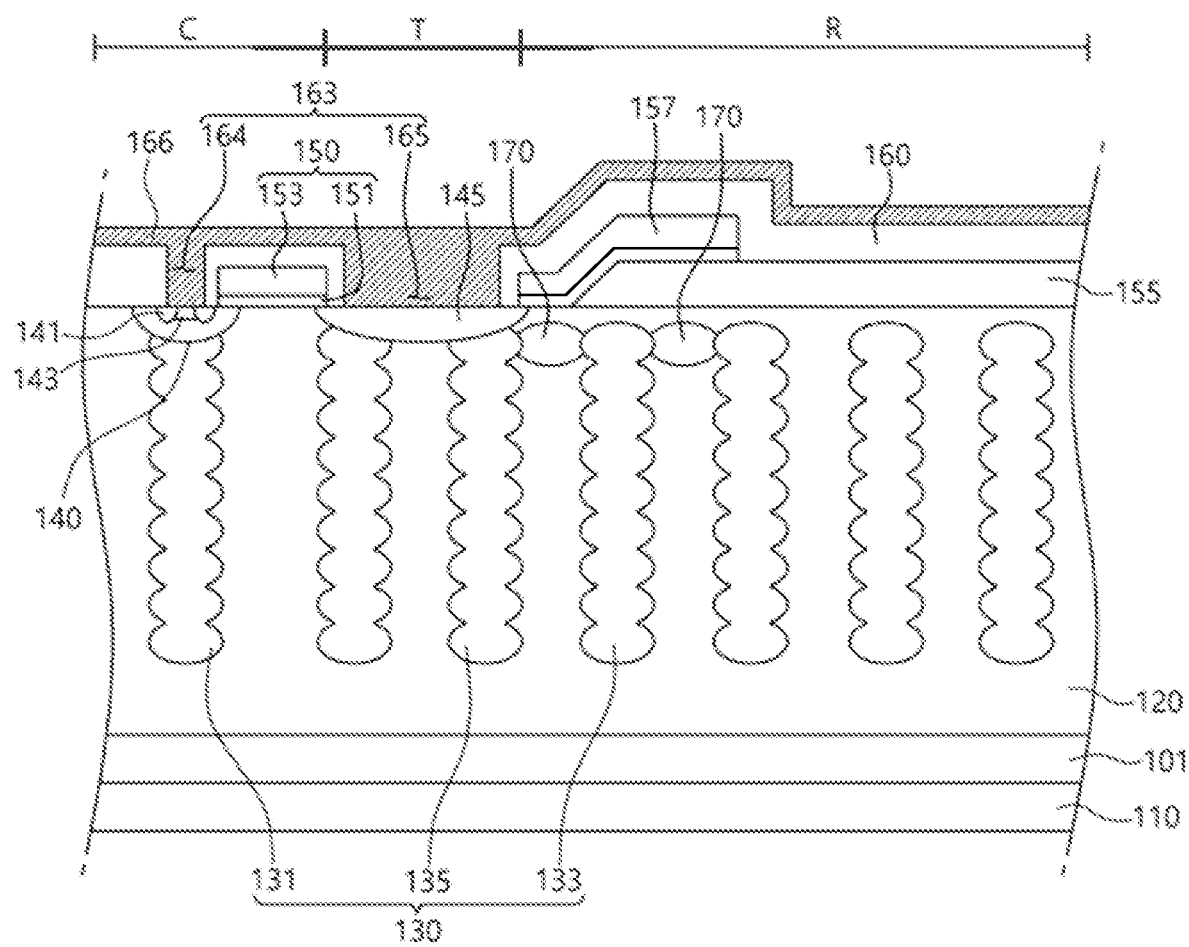
Figure 20:
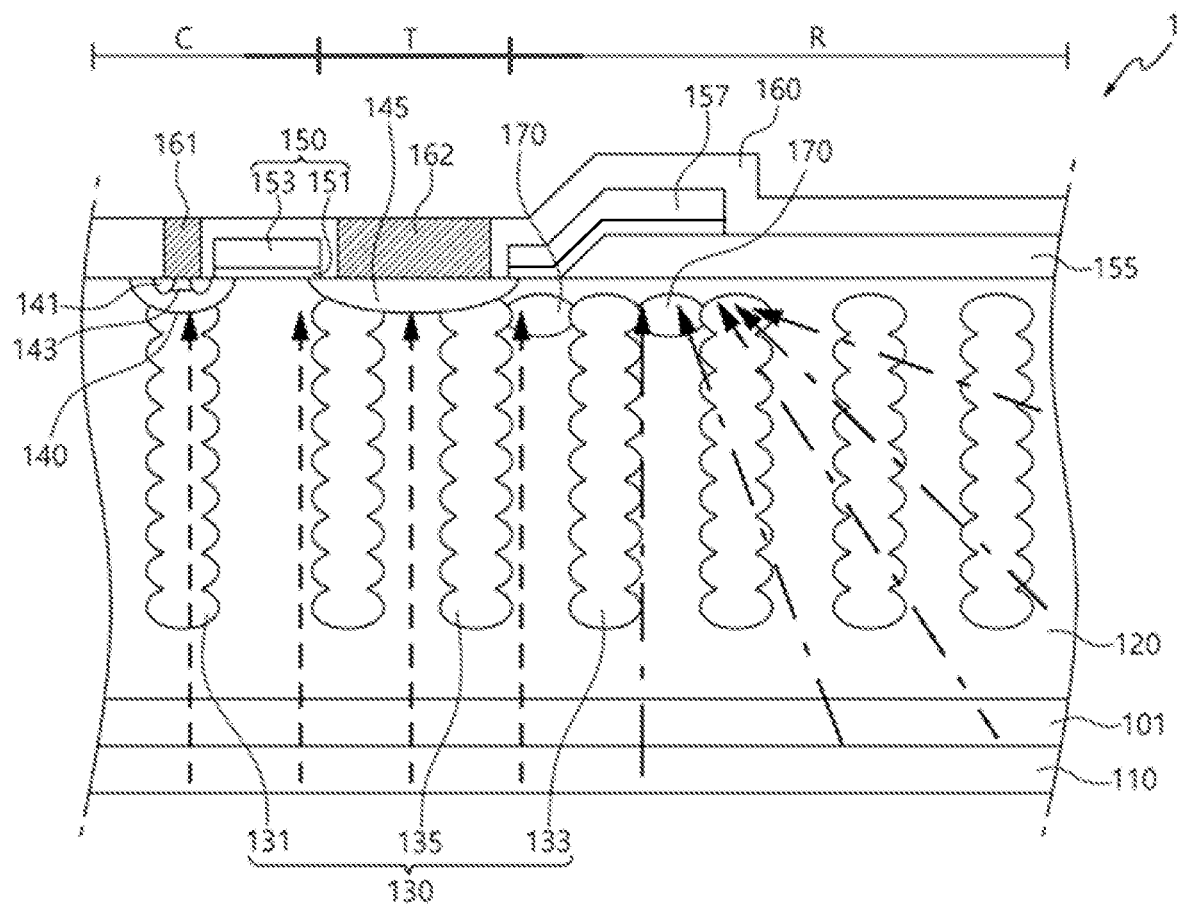

Then, referring to FIG. 19, a first contact 161 and a second contact 162 may be formed in the contact holes 163. For example, a metal layer 166 may be deposited on the interlayer insulating layer 160 and in the first contact hole 164 and the second contact hole 165. Then, referring to FIG. 20, the metal layer 166 remaining on the interlayer insulating layer 160 outside of the first and second contact holes 164 and 165 may be removed by chemical mechanical polishing (CMP) or the like.

The foregoing detailed description may be merely an example of the present disclosure. Also, the inventive concepts may be explained by describing various embodiments, and can be used in various combinations, modifications, and environments. That is, the inventive concept may be amended or modified without departing from the scope of the technical idea(s) and/or knowledge in the art. The foregoing embodiments are for illustrating various modes for implementing the technical idea(s) of the present disclosure, and various modifications may be made therein according to specific application fields and/or uses of the present disclosure. Therefore, the foregoing detailed description of the present disclosure is not intended to limit the inventive concept to the disclosed embodiments.

What is claimed is:

1. A superjunction semiconductor device comprising:
a substrate;
an epitaxial layer on the substrate;
pillars in the epitaxial layer, the pillars comprising a plurality of first pillars in a cell region, a plurality of second pillars in a ring region, and a plurality of third pillars in a transition region;
a first body region in the epitaxial layer and electrically connected to a corresponding one of the first pillars;
a source in the first body region;
a gate on the epitaxial layer;
an interlayer insulating layer on the epitaxial layer and covering the gate;
a first contact in the cell region and passing through the interlayer insulating layer;
a second contact in the transition region and passing through the interlayer insulating layer; and
a connector connecting adjacent pillars,
wherein the connector has a first width less than half of a second width of each of the second pillars and/or the third pillars.

2. The superjunction semiconductor device 1, wherein the pillars and the connector comprise impurity regions having the first conductivity type.

3. The superjunction semiconductor device 1, wherein the second pillars and the third pillars are spaced apart from each other along a first direction in the epitaxial layer, and
the connector connects adjacent second and third pillars close to a boundary between the transition region and the ring region.

4. The superjunction semiconductor device 3, wherein the connector further connects adjacent second pillars close to the boundary between the transition region and the ring region.

5. The superjunction semiconductor device 1, further comprising a second body region in the epitaxial layer and connecting the second pillars along a first direction.

6. The superjunction semiconductor device 6, wherein the second body region is continuous in at least in a corner area of the transition region.

7. The superjunction semiconductor device 6, wherein the second contact is continuous at least in a corner area of the transition region.

8. The superjunction semiconductor device 6, wherein the second body region comprises a plurality of second body regions spaced apart from each other in the transition region, and
the second contact extends to a boundary between the transition region and the ring region.

9. A superjunction semiconductor device comprising:
a substrate;
an epitaxial layer on the substrate;
pillars in the epitaxial layer, the pillars comprising a plurality of first pillars in a cell region, a plurality of second pillars in a ring region, and a plurality of third pillars in a transition region;
a first body region in the epitaxial layer and electrically connected to a corresponding one of the first pillars;
a second body region in the epitaxial layer and connecting the second pillars along a first direction;
a gate on the epitaxial layer;
an interlayer insulating layer on the epitaxial layer and covering the gate;
a first contact in the cell region and passing through the interlayer insulating layer; and
a second contact in the transition region and passing through the interlayer insulating layer,
wherein the second contact is continuous in the transition region.

10. The superjunction semiconductor device 10, wherein the second body region is continuous in an entire area of the transition region.

11. A superjunction semiconductor device comprising:
a substrate;
an epitaxial layer on the substrate;
pillars in the epitaxial layer, the pillars comprising a plurality of first pillars in a cell region, a plurality of second pillars in a ring region, and a plurality of third pillars in a transition region;
a first body region in the epitaxial layer and electrically connected to a corresponding one of the first pillars;
a second body region in the epitaxial layer and connecting the second pillars along a first direction;
a gate on the epitaxial layer;
an interlayer insulating layer on the epitaxial layer and covering the gate;
a first contact in the cell region and passing through the interlayer insulating layer; and a second contact in the transition region and passing through the interlayer insulating layer,
wherein the second contact extends to a position close to a boundary between the transition region and the ring region, and the second body region is continuous in at least in a corner area of the transition region.

12. The superjunction semiconductor device 13, wherein the second body region comprises a plurality of second body regions spaced apart from each other along an extension direction of the transition region in a plan view.

13. The superjunction semiconductor device 13, wherein the second contact is continuous at least in the corner area of the transition region.

* * * * *